(12) United States Patent
Shih et al.

(10) Patent No.: US 10,937,876 B2
(45) Date of Patent: Mar. 2, 2021

(54) SOURCE/DRAIN FEATURE TO CONTACT INTERFACES

(71) Applicant: Taiwan Semiconductor Manufacturing Co., Ltd., Hsinchu (TW)

(72) Inventors: Ding-Kang Shih, New Taipei (TW); Sung-Li Wang, Hsinchu County (TW); Pang-Yen Tsai, Hsin-Chu Hsian (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/276,833

(22) Filed: Feb. 15, 2019

(65) Prior Publication Data

US 2020/0135874 A1 Apr. 30, 2020

Related U.S. Application Data

(60) Provisional application No. 62/751,038, filed on Oct. 26, 2018.

(51) Int. Cl.
*H01L 29/417* (2006.01)
*H01L 29/78* (2006.01)
(Continued)

(52) U.S. Cl.
CPC .. *H01L 29/41791* (2013.01); *H01L 21/02381* (2013.01); *H01L 21/02532* (2013.01);
(Continued)

(58) Field of Classification Search
None
See application file for complete search history.

(56) References Cited

U.S. PATENT DOCUMENTS

| 8,772,109 B2 | 7/2014 | Colinge |
| 8,785,285 B2 | 7/2014 | Tsai et al. |

(Continued)

FOREIGN PATENT DOCUMENTS

| CN | 105529253 | 7/2018 |
| JP | 2009283826 | 12/2009 |

(Continued)

OTHER PUBLICATIONS

Min, B.-G. et al., "Behavior of strain at a thin Ge pile-up layer formed by dry oxidation of a Si0.7Ge0.3 film", Thin Solid Films, vol. 518, Issue 8, Feb. 1, 2010, pp. 2065-2069.

(Continued)

*Primary Examiner* — Andres Munoz
(74) *Attorney, Agent, or Firm* — Haynes and Boone, LLP

(57) ABSTRACT

Examples of an integrated circuit with an interface between a source/drain feature and a contact and examples of a method for forming the integrated circuit are provided herein. In some examples, a substrate is received having a source/drain feature disposed on the substrate. The source/drain feature includes a first semiconductor element and a second semiconductor element. The first semiconductor element of the source/drain feature is oxidized to produce an oxide of the first semiconductor element on the source/drain feature and a region of the source/drain feature with a greater concentration of the second semiconductor element than a remainder of the source/drain feature. The oxide of the first semiconductor element is removed, and a contact is formed that is electrically coupled to the source/drain feature. In some such embodiments, the first semiconductor element includes silicon and the second semiconductor element includes germanium.

20 Claims, 23 Drawing Sheets

(51) Int. Cl.
*H01L 29/08* (2006.01)
*H01L 29/66* (2006.01)
*H01L 21/02* (2006.01)
*H01L 21/762* (2006.01)
*H01L 21/8238* (2006.01)
*H01L 27/092* (2006.01)
*H01L 29/165* (2006.01)

(52) U.S. Cl.
CPC .. *H01L 21/02576* (2013.01); *H01L 21/02579* (2013.01); *H01L 21/76202* (2013.01); *H01L 21/823814* (2013.01); *H01L 27/0924* (2013.01); *H01L 29/0847* (2013.01); *H01L 29/165* (2013.01); *H01L 29/66795* (2013.01); *H01L 29/785* (2013.01); *H01L 29/7831* (2013.01); *H01L 29/7848* (2013.01); *H01L 21/823871* (2013.01); *H01L 29/665* (2013.01); *H01L 29/66545* (2013.01)

(56) References Cited

U.S. PATENT DOCUMENTS

| | | |
|---|---|---|
| 8,816,444 B2 | 8/2014 | Wann et al. |
| 8,823,065 B2 | 9/2014 | Wang et al. |
| 8,860,148 B2 | 10/2014 | Hu et al. |
| 9,105,490 B2 | 8/2015 | Wang et al. |
| 9,236,267 B2 | 1/2016 | De et al. |
| 9,236,300 B2 | 1/2016 | Liaw |
| 9,520,482 B1 | 12/2016 | Chang et al. |
| 9,576,814 B2 | 2/2017 | Wu et al. |
| 10,283,624 B1* | 5/2019 | Lee .................. H01L 29/66636 |
| 2007/0187767 A1* | 8/2007 | Yasutake ............. H01L 29/7848 257/368 |
| 2011/0024804 A1* | 2/2011 | Chang .................. H01L 29/785 257/288 |
| 2014/0273366 A1* | 9/2014 | Lin ................... H01L 21/28518 438/200 |
| 2017/0012113 A1* | 1/2017 | Park ................... H01L 21/0245 |

FOREIGN PATENT DOCUMENTS

| | | |
|---|---|---|
| KR | 20060100433 | 9/2006 |
| WO | 2005057612 A2 | 6/2005 |

OTHER PUBLICATIONS

Min, B.-G. et al., "Formation of a Ge-rich layer during the oxidation of strained Si1-xGex", Journal of Applied Physics 100, Department of Ceramic Engineering, Yonsei University, Seoul, Korea, Jul. 7, 2006, 4 pages.

Nishimura, Tomonori et al., "Evidence for strong Fermi-level pinning due to metal-induced gap states at metal/germanium interface", Applied Physics Letters 91, Department of Materials Engineering, School of Engineering, The University of Tokyo, Tokyo, Japan, Sep. 2007, 4 pages.

* cited by examiner

SOURCE/DRAIN FEATURE TO CONTACT INTERFACES

PRIORITY DATA

The present application claims the benefit of U.S. Provisional Application No. 62/751,038, entitled "Source/Drain Feature to Contact Interfaces," filed Oct. 26, 2018, herein incorporated by reference in its entirety.

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. However, each iteration of size reduction presents greater challenges to both design and manufacturing. Through advances in these areas, increasingly complex designs are being fabricated with precision and reliability.

As technology advances, parasitic effects, such as undesirable resistances and capacitances, have become more prominent. These parasitic effects may have a greater impact with each generation of improvements because the new techniques form smaller devices that are closer together and operate at lower voltages. As an example, undesirable resistance may occur at an interface between conductive features or at an interface between a conductive feature and a circuit feature such as a gate, source, or drain. The resistance of such an interface may be due to the quality of the interface as well as the composition of the materials at the interface, and the resistance may increase as the size of the interface decreases.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
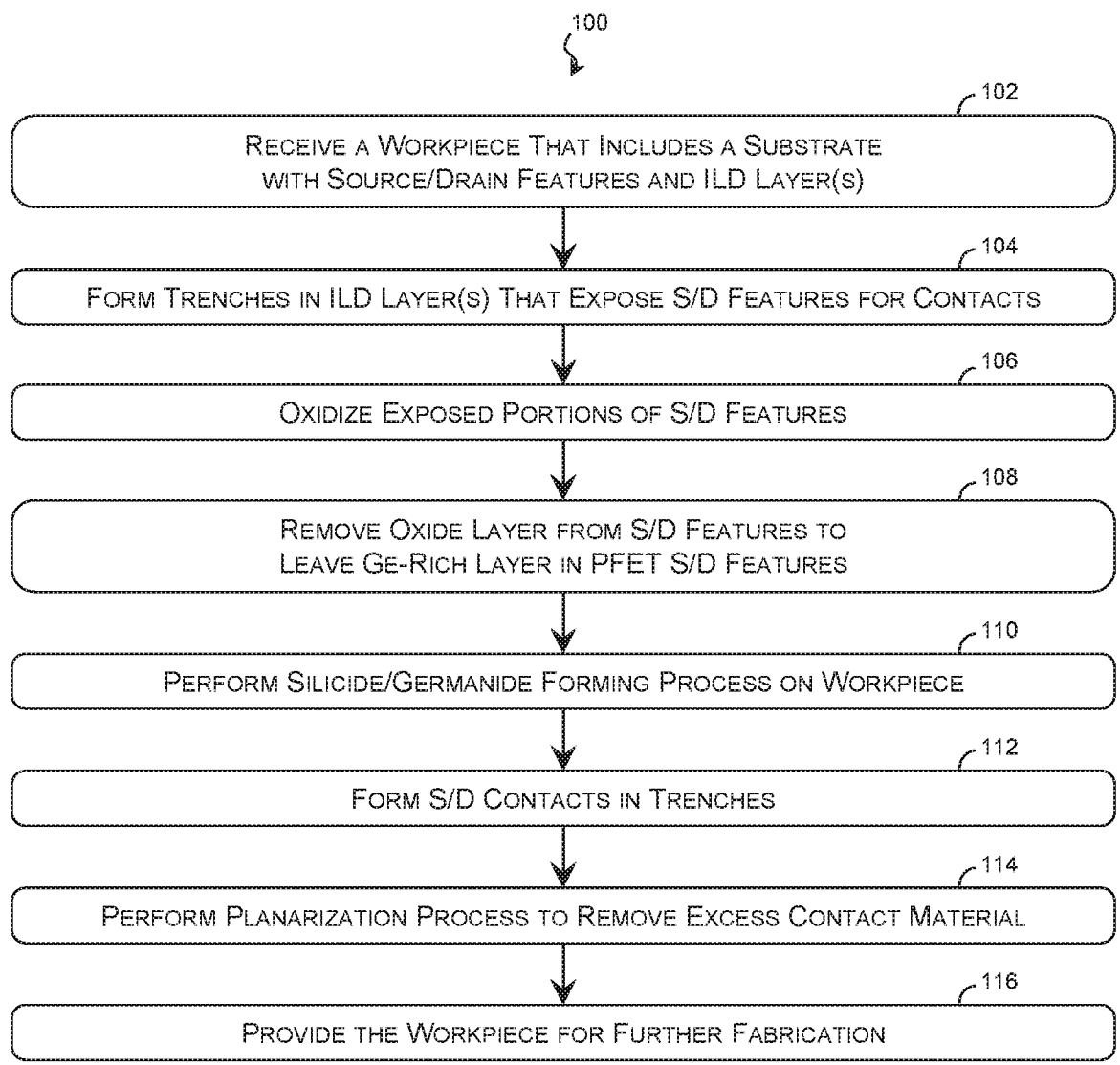
FIG. 1 is a flow diagram of a method of fabricating a workpiece with a source/drain interface according to various aspects of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. Moreover, the formation of a feature connected to and/or coupled to another feature in the present disclosure that follows may include embodiments in which the features are formed in direct contact, and may also include embodiments in which additional features may be formed interposing the features, such that the features may not be in direct contact.

In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features. In addition, the present disclosure may repeat reference numerals and/or letters in the various examples. This repetition is for the purpose of simplicity and clarity and does not in itself dictate a relationship between the various embodiments and/or configurations beyond the extent noted.

Advances in integrated circuit design and fabrication have delivered improvements in circuit speed and efficiency. However, despite new structures and new fabrication techniques, transistors and other circuit elements still experience significant losses and inefficiencies. In fact, some parasitic effects increase when devices shrink due to smaller conductors with higher resistance, thinner dielectrics with reduced insulation, and/or other factors. These parasitic effects may waste energy, produce excess heat, reduce maximum operating frequency, and/or increase minimum operating voltage. In extreme cases, they may lead to premature device failure.

One particular source of parasitic resistance is the interface between a source/drain feature of a circuit device, such as a Field Effect Transistor (FET) and/or a Fin-like FET (FinFET), and a contact that electrically couples to the source/drain feature. The resistance at the interface may be particularly high for source/drain features that contain silicon-germanium alloy semiconductors. The present disclosure provides a technique for forming an integrated circuit device that includes performing an oxidation process on the source/drain features to create a germanium-rich layer at the top of the source/drain features. This germanium-rich layer is near where a contact will couple, and has been determined to lower the resistance at the interface with the contact.

Furthermore, in some examples, the technique selectively forms the germanium-rich layer in SiGe-containing source/drain features of some devices without adversely impacting Si-containing source/drain features of other devices on the same workpiece. This may avoid a separate masking step to protect the other devices. Moreover, in some examples, the technique selectively forms the germanium-rich layer without additional epitaxial deposition and/or implantation processes. Epitaxy and implantation may add to the fabrication cost and contribute to the thermal budget, and both types of process may cause damage to the surrounding structures. Accordingly, it is beneficial to avoid additional epitaxial deposition and implantation processes where possible.

These benefits, however, are merely examples, and unless otherwise noted, no embodiment is required to provide any particular advantage.

Examples of an integrated circuit with germanide source/drain interfaces and an example of a method of forming such a circuit are described with reference to FIGS. 1-8. In that regard, FIG. 1 is a flow diagram of a method 100 of fabricating a workpiece with a source/drain interface according to various aspects of the present disclosure. Additional steps can be provided before, during, and after the method 100, and some of the steps described can be replaced or eliminated for other embodiments of the method 100.

FIGS. 2-8 are cross-sectional diagrams of the workpiece 200, taken along a fin-length direction, at points in the method 100 of fabrication according to various aspects of the present disclosure. FIGS. 2-8 have been simplified for the sake of clarity and to better illustrate the concepts of the present disclosure. Additional features may be incorporated into the workpiece 200, and some of the features described below may be replaced or eliminated for other embodiments of the workpiece 200.

Figure 2:
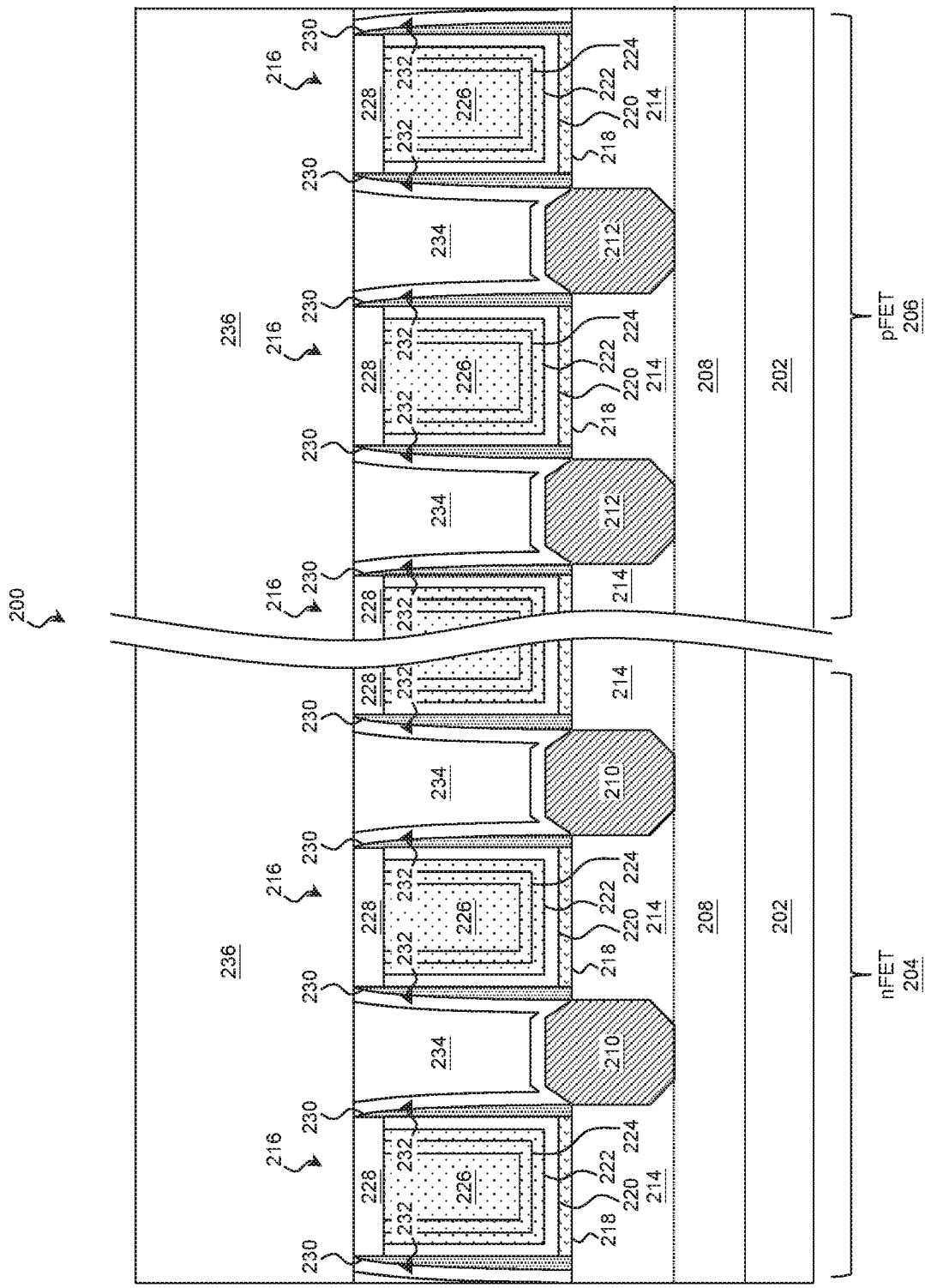
FIGS. 2-8 are cross-sectional diagrams of a workpiece, taken along a fin-length direction, at points in a method of fabrication according to various aspects of the present disclosure.

Referring to block 102 of FIG. 1 and to FIG. 2, the workpiece 200 is received. The workpiece 200 includes a substrate 202 upon which devices are to be formed. In various examples, the substrate 202 includes an elementary (single element) semiconductor, such as silicon or germanium in a crystalline structure; a compound semiconductor, such as silicon carbide, gallium arsenic, gallium phosphide, indium phosphide, indium arsenide, and/or indium antimonide; an alloy semiconductor such as SiGe, GaAsP, AlInAs, AlGaAs, GaInAs, GaInP, and/or GaInAsP; a non-semiconductor material, such as soda-lime glass, fused silica, fused quartz, and/or calcium fluoride ($CaF_2$); and/or combinations thereof.

The substrate 202 may be uniform in composition or may include various layers, some of which may be selectively etched to form the fins. The layers may have similar or different compositions, and in various embodiments, some substrate layers have non-uniform compositions to induce device strain and thereby tune device performance. Examples of layered substrates also include silicon-on-insulator (SOI) substrates 202. In some such examples, an insulator layer of an SOI substrate 202 includes a semiconductor oxide, a semiconductor nitride, a semiconductor oxynitride, a semiconductor carbide, and/or other suitable insulator materials.

Doped regions, such as wells, may be formed on the substrate 202, and some regions of the substrate 202 may be doped with p-type dopants, such as boron, $BF_2$, or indium while other regions of the substrate 202 may be doped with n-type dopants, such as phosphorus or arsenic; and/or other suitable dopants including combinations thereof. The doping of a particular region of the substrate 202 may depend on the devices to be formed on the region. In an example, the substrate 202 includes a first region 204 for forming n-channel (nFET) devices and a second region 206 for forming p-channel (pFET) devices.

In some examples, the devices to be formed on the substrate 202 extend out of the substrate 202. For example, Fin-like Field Effect Transistors (FinFETs) and/or other non-planar devices may be formed on device fins 208 disposed on the substrate 202. The device fins 208 are representative of any raised feature and include FinFET device fins 208 as well as fins 208 for forming other raised active and passive devices upon the substrate 202. The fins 208 may be formed by etching portions of the substrate 202, by depositing various layers on the substrate 202 and etching the layers, and/or by other suitable techniques. For example, the fins 208 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

The fins 208 may be similar in composition to the substrate 202 or may be different therefrom. For example, in some embodiments, the substrate 202 includes primarily silicon, while the fins 208 include one or more layers that are primarily germanium or a SiGe semiconductor. In some embodiments, the substrate 202 includes a SiGe semiconductor, and the fins 208 include one or more layers that include a SiGe semiconductor with a different ratio of silicon to germanium.

Each device fin 208 may include any number of circuit devices, such as FinFETs, that, in turn, each include a pair of opposing source/drain features (e.g., nFET source/drain features 210 and pFET source/drain features 212) formed on the fin 208 and separated by a channel region 214. The source/drain features 210 and 212 of the FinFETs may include an epitaxially-grown semiconductor and one or more dopants. Both the semiconductor and the dopants may differ between the nFET source/drain features 210 of the nFET region 204 and the pFET source/drain features 212 of the pFET region 206. In some examples, the nFET source/drain features 210 include an elementary semiconductor (e.g., silicon) and n-type dopants (e.g., phosphorus and/or arsenic). In contrast, the example pFET source/drain features 212 include an alloy semiconductor (e.g., SiGe) and p-type dopants (e.g., boron, $BF_2$, and/or indium). Accordingly, in various such examples, the nFET source/drain features 210 include SiP, SiCP, and/or SiAs, and the pFET source/drain features 212 include SiGeB, and/or SiGeIn, with a relatively high concentration of Ge relative to Si (e.g., excluding dopants, a concentration of Ge greater than about 50 atomic percent).

The flow of carriers (electrons for an n-channel FinFET and holes for a p-channel FinFET) from the source to the drain is controlled by a voltage applied to a gate stack 216 adjacent to and overwrapping the channel region 214. The raised channel region 214 provides a larger surface area proximate to the gate stack 216 than comparable planar devices. This strengthens the electromagnetic field interactions between the gate stack 216 and the channel region 214, which may reduce leakage and short channel effects associated with smaller devices. Thus in many embodiments, FinFETs and other nonplanar devices deliver better performance in a smaller footprint than their planar counterparts do.

An example gate stack 216 may include an interfacial layer 218 disposed on the top and side surfaces of the channel regions 214. The interfacial layer 218 may include an interfacial material, such as a semiconductor oxide, semiconductor nitride, semiconductor oxynitride, other semiconductor dielectrics, other suitable interfacial materials, and/or combinations thereof. The gate stack 216 may include a gate dielectric 220 disposed on the interfacial layer 218. The gate dielectric 220 may also extend vertically along the sides of the gate stack 216. The gate dielectric 220 may include one or more dielectric materials, which are commonly characterized by their dielectric constant relative to silicon dioxide. In some embodiments, the gate dielectric 220 includes a high-k dielectric material, such as $HfO_2$, HfSiO, HfSiON, HfTaO, HfTiO, HfZrO, zirconium oxide, aluminum oxide, hafnium dioxide-alumina ($HfO_2$—$Al_2O_3$) alloy, other suitable high-k dielectric materials, and/or combinations thereof. Additionally or in the alternative, the gate dielectric 220 may include other dielectrics, such as a semiconductor oxide, semiconductor nitride, semiconductor oxynitride, semiconductor carbide, amorphous carbon, TEOS, other suitable dielectric material, and/or combinations thereof. The gate dielectric 220 may be formed to any suitable thickness, and in some examples, the gate dielectric 220 has a thickness of between about 0.1 nm and about 3 nm.

A gate electrode is disposed on the gate dielectric 220. The gate electrode may include a number of different conductive layers, of which three exemplary layers (a capping layer 222, work function layer(s) 224, and an electrode fill 226) are shown. With respect to the capping layer 222, it may include any suitable conductive material including metals (e.g., W, Al, Ta, Ti, Ni, Cu, Co, etc.), metal nitrides, and/or metal silicon nitrides. In various embodiments, the capping layer 222 includes TaSiN, TaN, and/or TiN.

The gate electrode may include one or more work function layers 224 on the capping layer 222. Suitable work function layer 224 materials include n-type and/or p-type work function materials based on the type of device. Exemplary p-type work function metals include TiN, TaN, Ru, Mo, Al, WN, $ZrSi_2$, $MoSi_2$, $TaSi_2$, $NiSi_2$, WN, other suitable p-type work function materials, and/or combinations thereof. Exemplary n-type work function metals include Ti, Ag, TaAl, TaAlC, TiAlN, TaC, TaCN, TaSiN, Mn, Zr, other suitable n-type work function materials, and/or combinations thereof.

The gate electrode may also include an electrode fill 226 on the work function layer(s) 224. The electrode fill 226 may include any suitable material including metals (e.g., W, Al, Ta, Ti, Ni, Cu, Co, etc.), metal oxides, metal nitrides, and/or combinations thereof, and in an example, the electrode fill 226 includes tungsten.

In some examples, the gate stack 216 includes a gate cap 228 on top of the gate dielectric 220, the capping layer 222, the work function layer(s) 224, and/or the electrode fill 226. The gate cap 228 may include any suitable material, such as: a dielectric material (e.g., a semiconductor oxide, a semiconductor nitride, a semiconductor oxynitride, a semiconductor carbide, a semiconductor oxycarbonitride, etc.), polysilicon, SOG, TEOS, PE-oxide, HARP-formed oxide, and/or other suitable material. In some examples, the gate cap 228 includes silicon oxycarbonitride. In some examples, the gate cap 228 has a thickness between about 1 nm and about 10 nm.

Sidewall spacers 230 are disposed on the side surfaces of the gate stacks 216. The sidewall spacers 230 may be used to offset the source/drain features 210 and 212 and to control the source/drain junction profile. In various examples, the sidewall spacers 230 include one or more layers of suitable materials, such as a dielectric material (e.g., a semiconductor oxide, a semiconductor nitride, a semiconductor oxynitride, a semiconductor carbide, a semiconductor oxycarbonitride, etc.), Spin On Glass (SOG), tetraethylorthosilicate (TEOS), Plasma Enhanced CVD oxide (PE-oxide), High-Aspect-Ratio-Process (HARP)-formed oxide, and/or other suitable material. In one such embodiment, the sidewall spacers 230 each include a first layer of silicon oxide, a second layer of silicon nitride disposed on the first layer, and a third layer of silicon oxide disposed on the second layer. In the embodiment, each layer of the sidewall spacers 230 has a thickness between about 1 nm and about 10 nm.

The workpiece 200 may also include a contact-etch stop layer (CESL) 232 disposed on the source/drain features 210 and 212 and alongside the sidewall spacers 230. The CESL 232 may include a dielectric (e.g., a semiconductor oxide, a semiconductor nitride, a semiconductor oxynitride, a semiconductor carbide, etc.) and/or other suitable material, and in various embodiments, the CESL 232 includes SiN, SiO, SiON, and/or SiC. In some examples, the CESL 232 has a thickness between about 1 nm and about 50 nm.

One or more Inter-Level Dielectric (ILD) layers (e.g., layers 234 and 236) are disposed on the source/drain features 210 and 212 and gate stacks 216 of the workpiece 200. The ILD layers 234 and 236 act as insulators that support and isolate conductive traces of an electrical multi-level interconnect structure. In turn, the multi-level interconnect structure electrically interconnects elements of the workpiece 200, such as the source/drain features 210 and 212 and the gate stacks 216. The ILD layers 234 and 236 may include a dielectric material (e.g., a semiconductor oxide, a semiconductor nitride, a semiconductor oxynitride, a semiconductor carbide, etc.), SOG, fluoride-doped silicate glass (FSG), phosphosilicate glass (PSG), borophosphosilicate glass (BPSG), Black Diamond®, Xerogel, Aerogel, amorphous fluorinated carbon, parylene, BCB, SiLK®, and/or combinations thereof.

Figure 3:
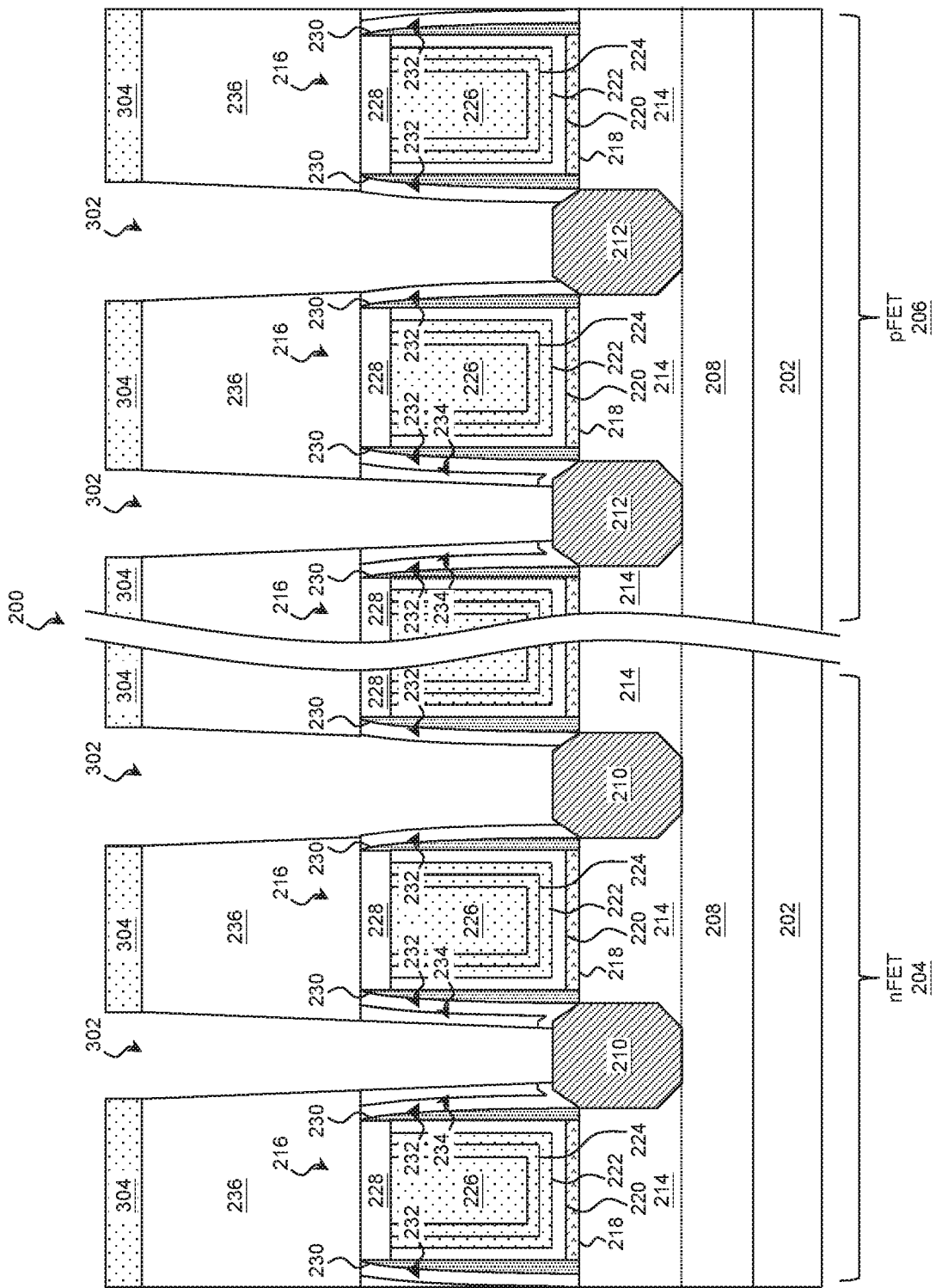
Figure 4:
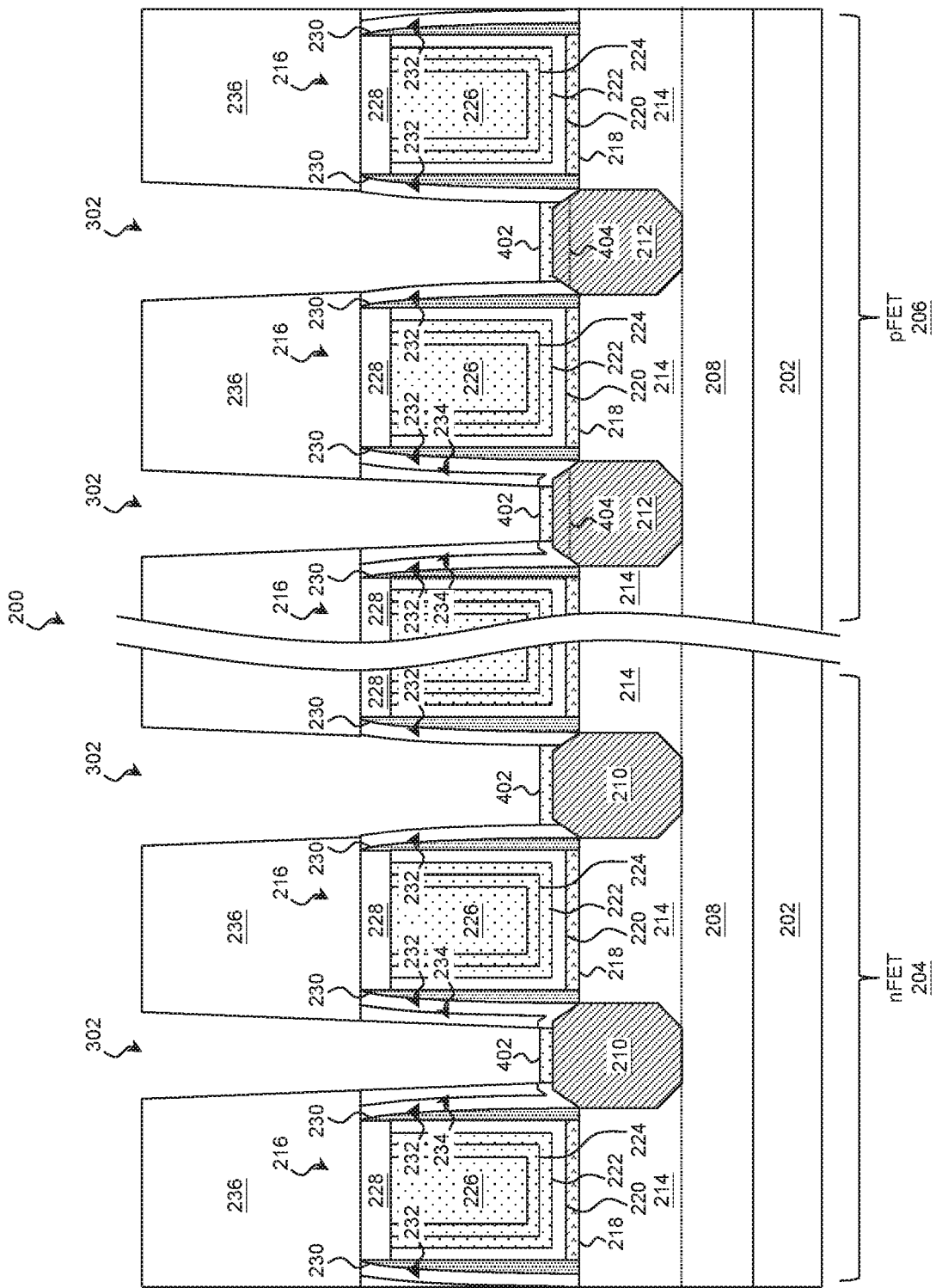

Referring to block 104 of FIG. 1 and to FIG. 3, trenches 302 are formed in the ILD layers 234 and 236 for source/drain contacts. The trenches 302 expose the source/drain features 210 and 212 at locations where conductive features of the interconnect are to be formed. In some such examples, this includes forming a photoresist 304 on the workpiece 200 and patterning the photoresist 304 in a photolithographic process to selectively expose portions of the ILD layers 234 and 236 to etch.

In one embodiment, a photolithographic system exposes the photoresist 304 to radiation in a particular pattern determined by a mask. Light passing through or reflecting off the mask strikes the photoresist 304 thereby transferring a pattern formed on the mask to the photoresist 304. In other such embodiments, the photoresist 304 is exposed using a direct write or maskless lithographic technique, such as laser patterning, e-beam patterning, and/or ion-beam patterning. Once exposed, the photoresist 304 is developed leaving the exposed portions of the resist, or in alternative examples, leaving the unexposed portions of the resist. An exemplary patterning process includes soft baking of the photoresist 304, mask aligning, exposure, post-exposure baking, developing the photoresist 304, rinsing, and drying (e.g., hard baking).

The portions of the ILD layers 234 and 236 exposed by the photoresist 304 are then etched using any suitable etching technique such as wet etching, dry etching, RIE, ashing, and/or other etching methods. In some embodiments, the etching process includes dry etching using an oxygen-based etchant, a fluorine-based etchant (e.g., $CF_4$, $SF_6$, $CH_2F_2$, $CHF_3$, and/or $C_2F_6$), a chlorine-based etchant (e.g., $Cl_2$, $CHCl_3$, $CCl_4$, and/or $BCl_3$), a bromine-based etchant (e.g., HBr and/or $CHBR_3$), an iodine-based etchant, other suitable etchant gases or plasmas, and/or combinations thereof.

Any remaining photoresist 304 may be removed after etching the trenches 302.

The trenches 302 may remove some or all of the ILD layer 234 and CESL 232 above the source/drain features 210 and 212 and may expose the top surfaces of the source/drain features 210 and 212 in whole or in part. Referring to block 106 of FIG. 1 and to FIG. 4, a controlled oxidation is performed on the workpiece 200 that oxidizes the exposed surfaces of the source/drain features 210 and 212. For those source/drain features 210 that include a semiconductor that is primarily silicon, the oxidation process may create a layer 402 of $SiO_X$ on the surface of the source/drain features 210. Because silicon oxidizes more readily than germanium, an oxidation process may draw silicon out of a silicon-germanium semiconductor to form a layer of predominantly silicon oxide at the surface. In such examples and others, the oxidation process of block 106 creates a layer 402 of $SiO_X$ on the surface of the SiGe source/drain features 212 as the process is configured to substantially avoid oxidation of the Ge within the source/drain features 212.

As a result of drawing out the silicon from a portion of the source/drain features 212, the oxidation process may form a Ge-rich layer 404 containing the remaining germanium just under the $SiO_X$ layer 402. The Ge-rich layer 404 has a higher concentration of Ge relative to Si than the remainder of the source/drain feature 212. In various examples, excluding dopants, the Ge-rich layer 404 contains between about 10 atomic percent and about 100 atomic percent Ge. In some such examples, the Ge-rich layer 404 contains only Ge and dopants. The $SiO_X$ layer 402 and Ge-rich layer 404 may be formed to have any suitable thickness, and in various examples, each has a thickness between about 1 nm and about 10 nm. The $SiO_X$ layer 402 may be substantially conformal and follow the contour of the top of the source/drain features 210 and 212.

The oxidation process may include any suitable oxidizing technique including dry ($O_2$) and/or wet ($H_2O$) oxidation techniques. In some examples, the oxidation process includes heating the workpiece 200 to temperature between about 250° C. and about 500° C. at a pressure between about 0.1 Torr and about $8 \times 10^5$ Torr and introducing an oxygen source such as $O_2$ or $H_2O$. The upper oxidation process temperature may be limited by the materials of the gate stack 216. The oxidation process may be performed for any suitable duration and, in various examples, is performed for between about 10 minutes and about 24 hours. In this way, the technique reliably forms a monocrystalline Ge-rich layer 404 in the pFET source/drain features 212 of the pFET region 206 without additional epitaxy or implantation processes.

Figure 5:
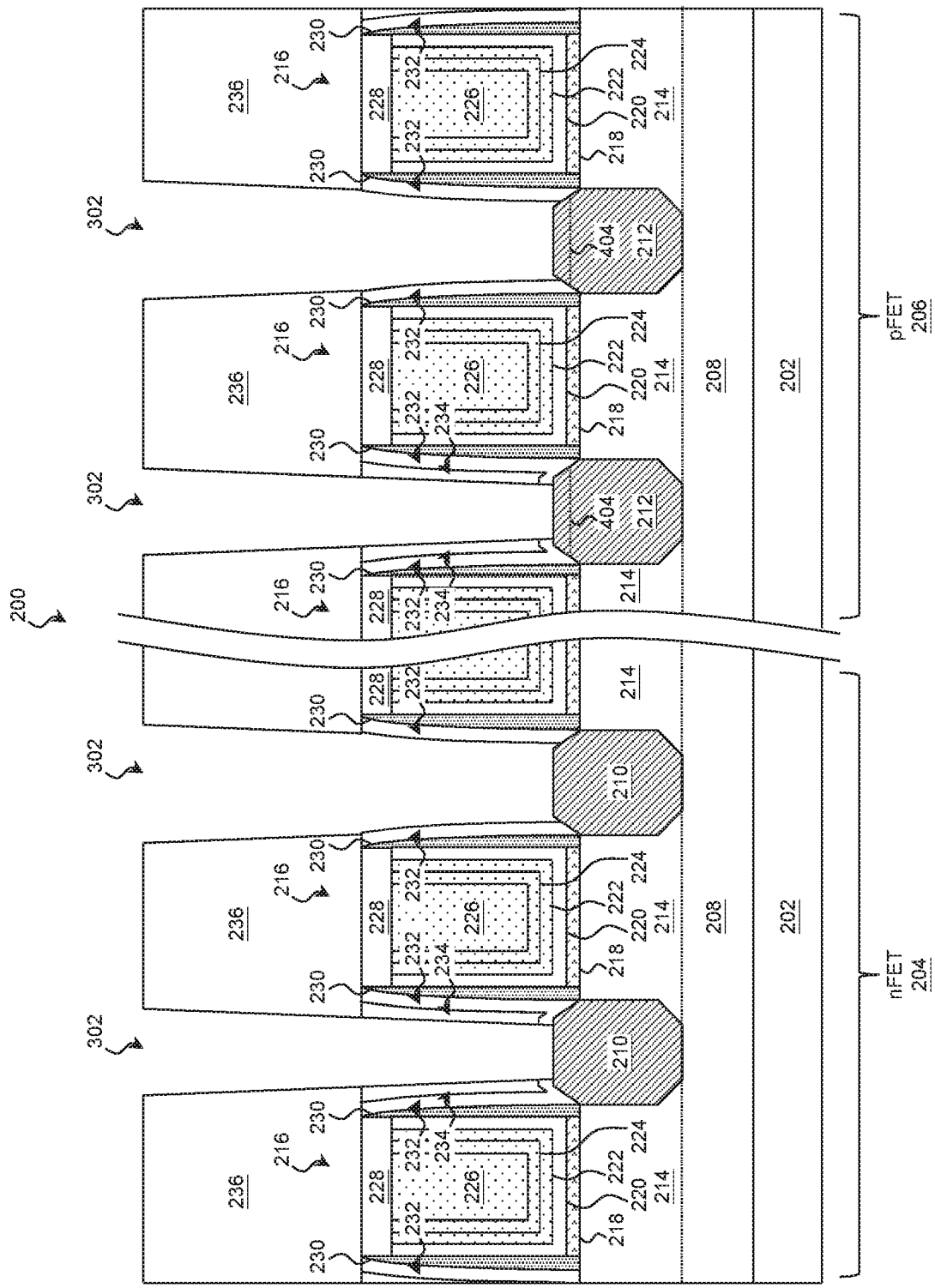

Referring to block 108 of FIG. 1 and to FIG. 5, the $SiO_x$ layers 402 are removed in a precleaning process. The precleaning process is controlled to avoid significant removal of the Ge-rich layer 404 of the pFET source/drain features 212. The precleaning process may include a dry cleaning process, a wet cleaning process, RIE, and/or other suitable cleaning methods. For example, in some embodiments, the precleaning process includes a plasma-assisted dry etch process that utilizes $NH_3$, $NF_3$, HF, and/or $H_2$. In some embodiments, the precleaning process includes a wet cleaning process that utilizes diluted hydrofluoric acid (DHF) solution. To avoid reforming $SiO_x$ on the surfaces of the source/drain features 210 and 212, the precleaning process may be performed in the same chamber as the subsequent silicidation process.

Figure 6:
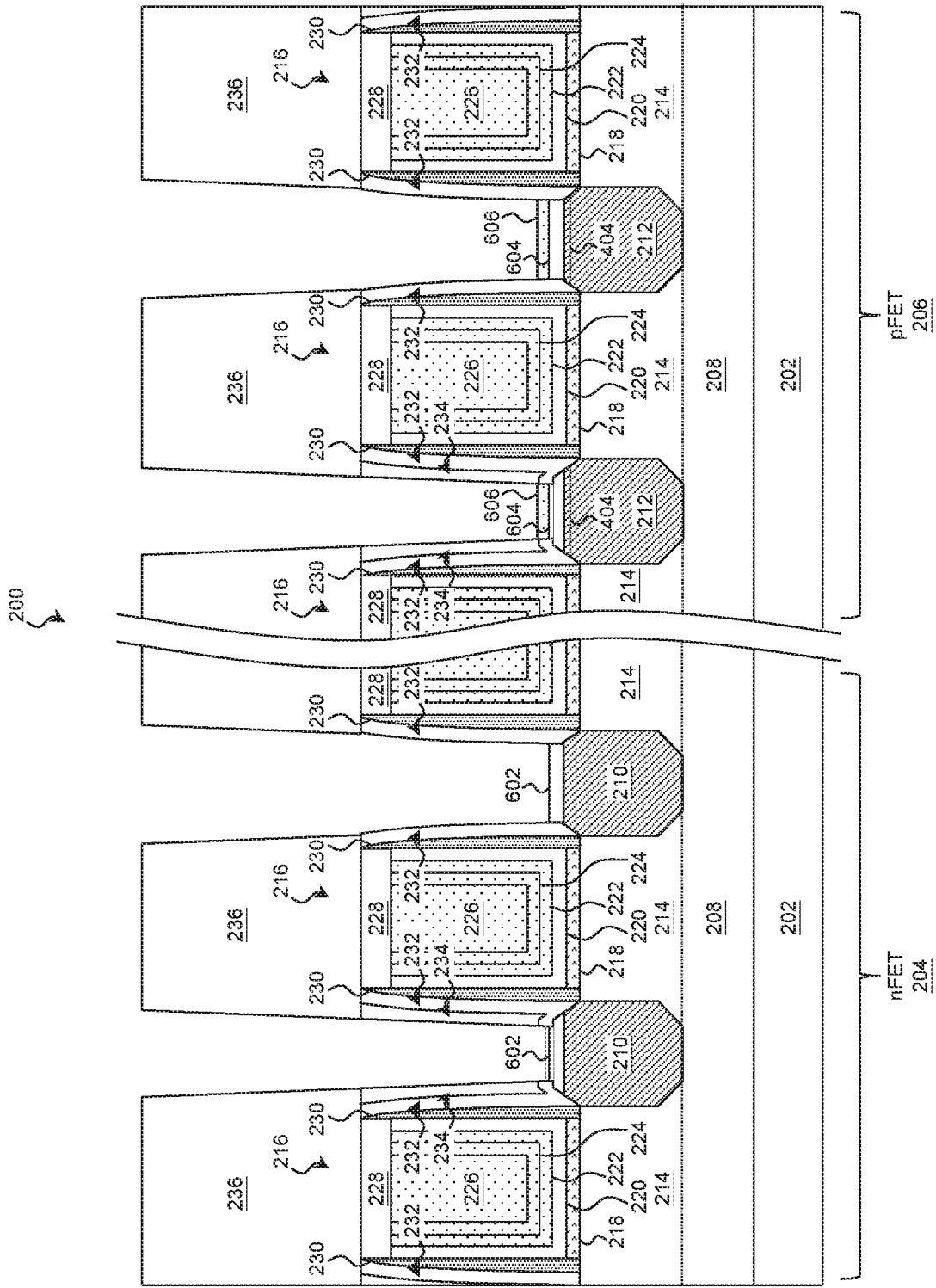

Referring to block 110 of FIG. 1 and to FIG. 6, a silicide/germanide forming process is performed on the workpiece 200. The silicide/germanide process introduces a metal or other conductive material into the source/drain features 210 and 212. In particular, the process may form a silicide layer 602 in silicon-containing source/drain features 210 in the nFET region 204 and a germanide layer 604 in the Ge-rich layer 404 of the source/drain features 212 in the pFET region 206.

The silicide/germanide process may include depositing a metal or other conductor on the workpiece 200. Suitable conductors include Ti, Er, Y, Yb, Eu, Tb, Lu, Th, Sc, Hf, Zr, Tb, Ta, Ni, Co, Pt, W, Ru, and/or other suitable conductors. The conductor may be deposited by Chemical Vapor Deposition (CVD), Atomic Layer Deposition (ALD), Plasma-Enhanced CVD (PE CVD), Plasma-Enhanced ALD (PEALD), Physical Vapor Deposition (PVD), and/or other suitable techniques.

In some examples, the silicide/germanide process includes one or more nitridation processes to provide a nitrogen source for a nitridized cap layer. The nitridation creates a barrier against inadvertent oxidation of the underlying materials from ambient oxygen prior to depositing subsequent materials of the contacts. The nitridation process may be performed in the same tool and/or the same chamber of the tool used to deposit the conductor. In various examples, a nitrogen-containing gas such as $N_2$ and/or $NH_3$ is supplied at an injection flow rate between about 20 sccm and about 200 sccm at a process temperature between about 20° C. and about 120° C. for between about 1 minute and about 30 minutes. Where PE CVD is used for nitridation, the plasma power for the PE CVD process may be between about 100 W and about 1000 W. Inert gasses such as argon or helium may be used for plasma ignition. The flow rate of the nitrogen-containing gas, the relative gas concentrations, the duration, the temperature, the field power, and other process conditions may be selected to control the nitrogen concentration of the resulting nitridized cap layer described in more detail below. In various examples, the nitridation process is configured to produce a nitridized cap layer with a nitrogen concentration between about 15 and about 40 atomic percent.

The workpiece 200 is annealed to react the conductor with the source/drain features 210 and 212 to form silicide and/or germanide. The annealing may also cause one or more nitridized capping layers to form on the silicide and/or germanide. Thereafter, any un-reacted metal may be removed.

In this manner, the silicide/germanide forming process may form a silicide layer 602 on the silicon-containing source/drain features 210 in the nFET region 204. The silicide layer 602 may have any suitable thickness, and in various examples, is between about 1 nm and about 10 nm thick. Similarly, the process may form a germanide layer 604 on the SiGE-containing source/drain features 212 in the pFET region 206 and a nitridized germanide cap 606 on the germanide layer 604. In various examples, the nitridized germanide cap 606 has a nitrogen concentration between about 15 and about 40 atomic percent.

In particular, the process may form the germanide layer 604 and the nitridized germanide cap 606 by consuming the Ge-rich layer 404. In some examples, only about 2 nm or less of the Ge-rich layer 404 remains. In some examples, the Ge-rich layer 404 is completely removed. The resulting germanide layer 604 and nitridized germanide cap 606 may have any suitable thickness. In various examples, the germanide layer 604 has a thickness between about 2 nm and about 5 nm, and the nitridized germanide cap 606 has a thickness between about 1 nm and about 3 nm. The greater concentration of germanium in the Ge-rich layer 404, the germanide layer 604, and/or the nitridized germanide cap

606 produced by the present technique has been determined to produce a better quality interface with subsequently formed contacts and reduced contact resistance.

Figure 7:
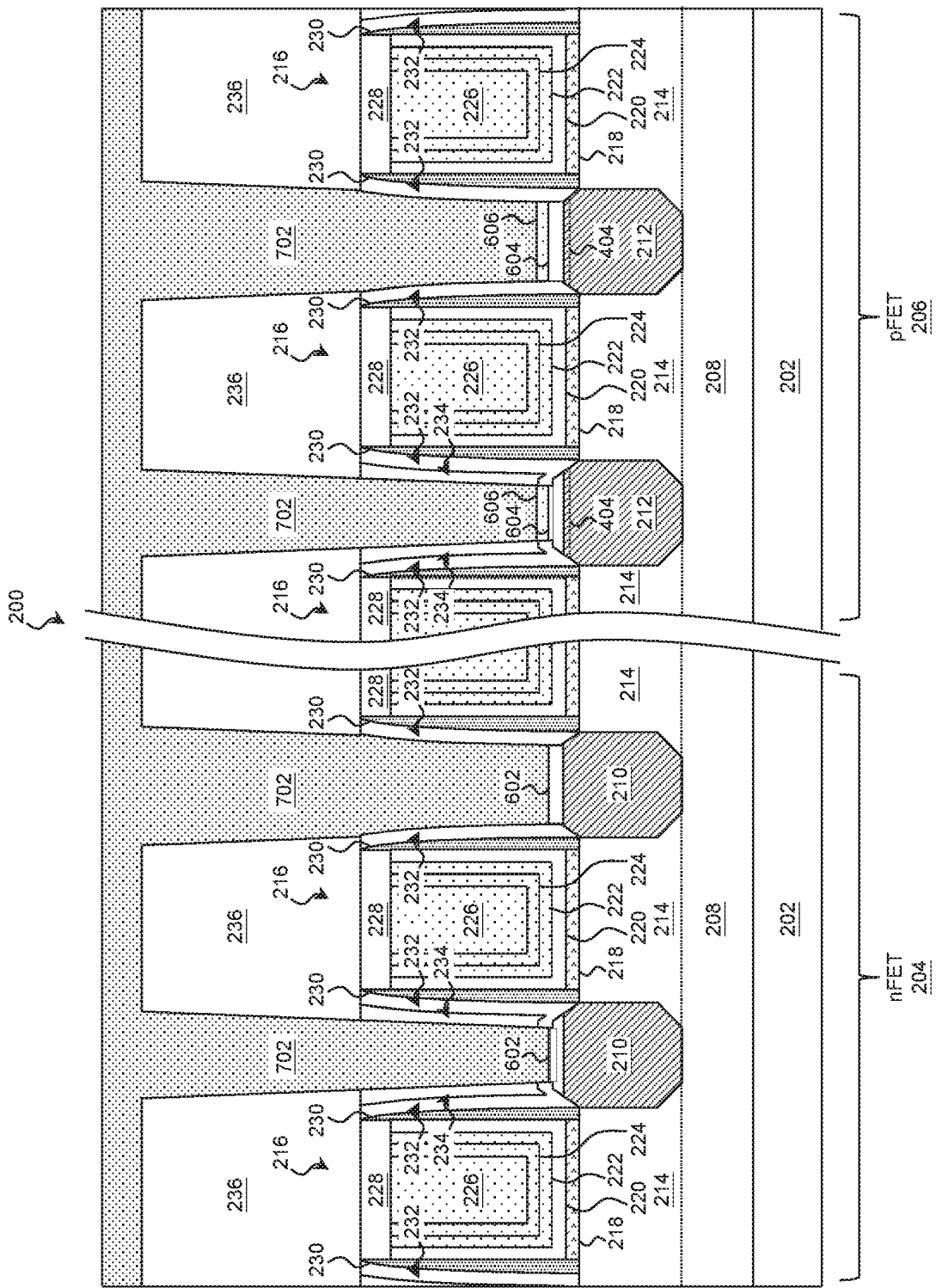

Referring to block 112 of FIG. 1 and to FIG. 7, source/drain contacts 702 are formed in the trenches 302 that couple to the source/drain features 210 and 212. In particular, the contacts 702 may physically and electrically couple to the silicide layer 602 of the nFET source/drain features 210 and to the germanide layer 604 and/or nitridized germanide cap 606 of the pFET source/drain features 212. The contacts 702 may include one or more layers of conductive materials such as metals (e.g., W, Al, Ta, Ti, Ni, Cu, etc.), metal oxides, metal nitrides, and/or combinations thereof. In some examples, a contact 702 contains a barrier layer that includes W, Ti, TiN, Ru, and/or combinations thereof and contains a Cu-containing fill material disposed on the barrier layer. In some examples, a contact 702 includes tungsten, which is deposited with or without a barrier layer. In some examples, a contact includes a cobalt contact material. The material(s) of the contacts 702 may be deposited by any suitable technique including PVD (e.g., sputtering), CVD, PE CVD, ALD, PEALD, and/or combinations thereof.

Figure 8:
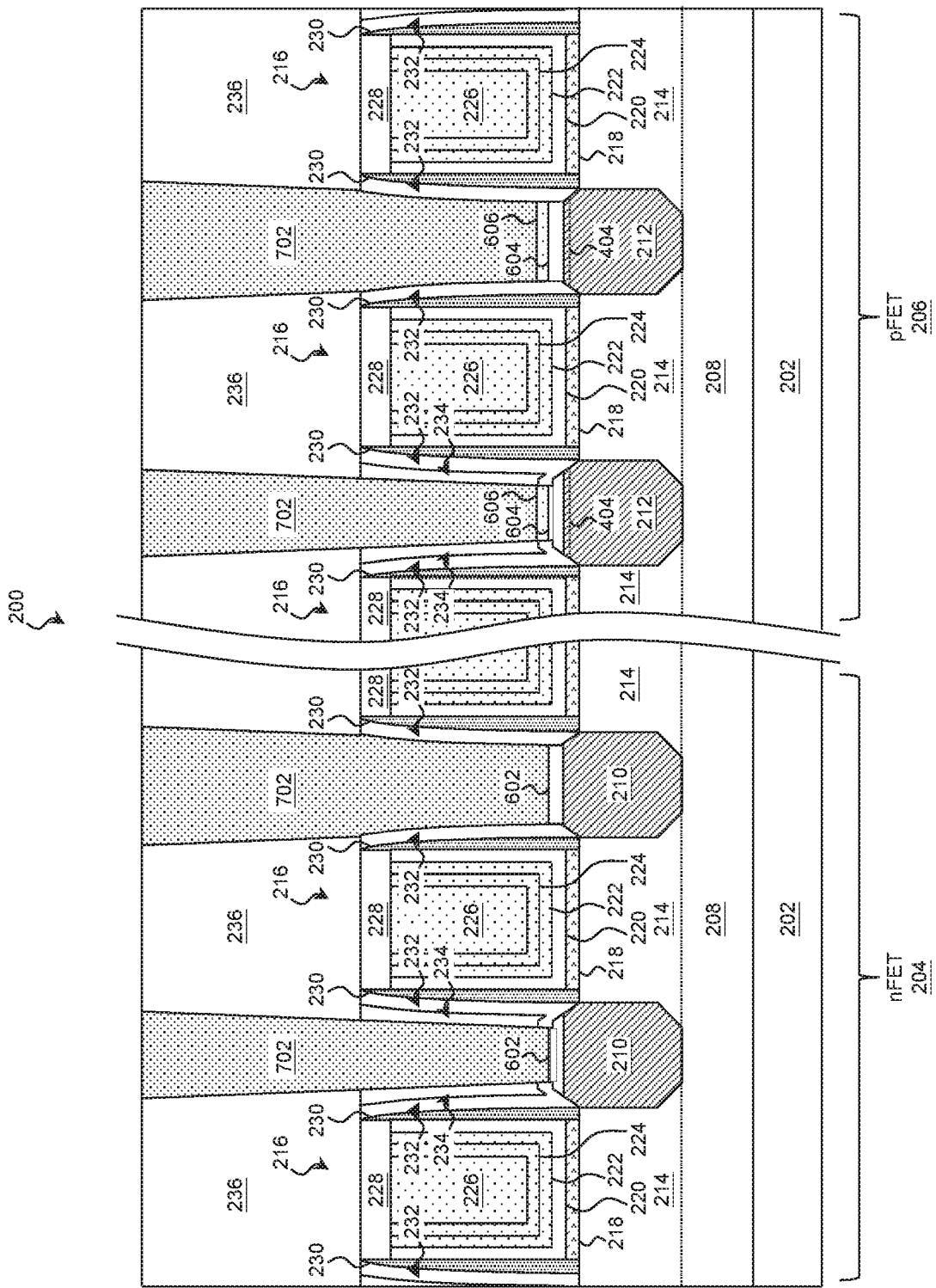

Referring to block 114 of FIG. 1 and to FIG. 8, a planarization process may be performed to remove portions of the contact material that are above the ILD layer 236.

Referring to block 116 of FIG. 1, the workpiece 200 is provided for further fabrication. In various examples, this includes forming a remainder of an electrical interconnect structure, dicing, packaging, and other fabrication processes.

Figure 9A:
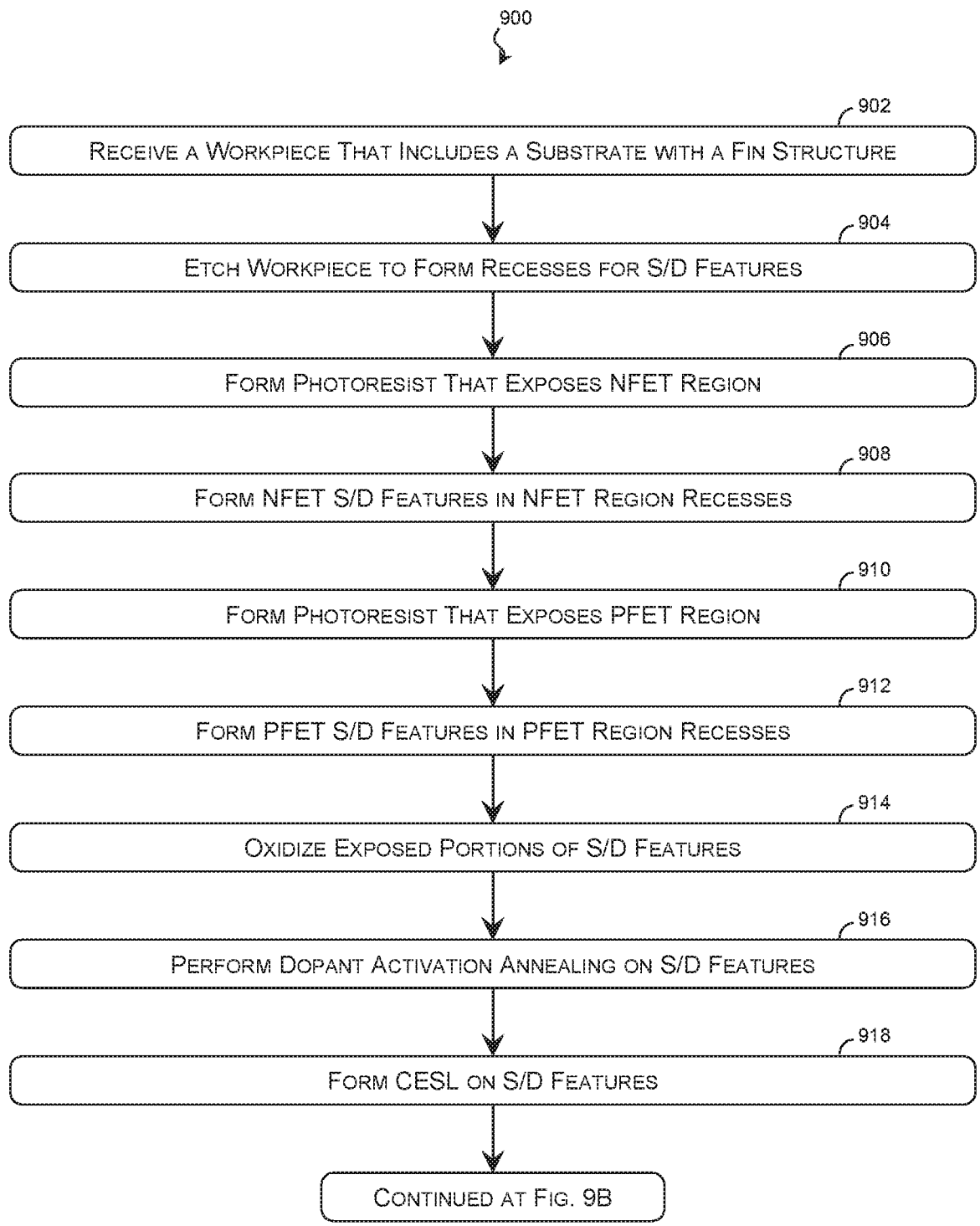
FIGS. 9A-9B are flow diagrams of a method of fabricating a workpiece with a source/drain interface according to various aspects of the present disclosure.
Figure 9B:
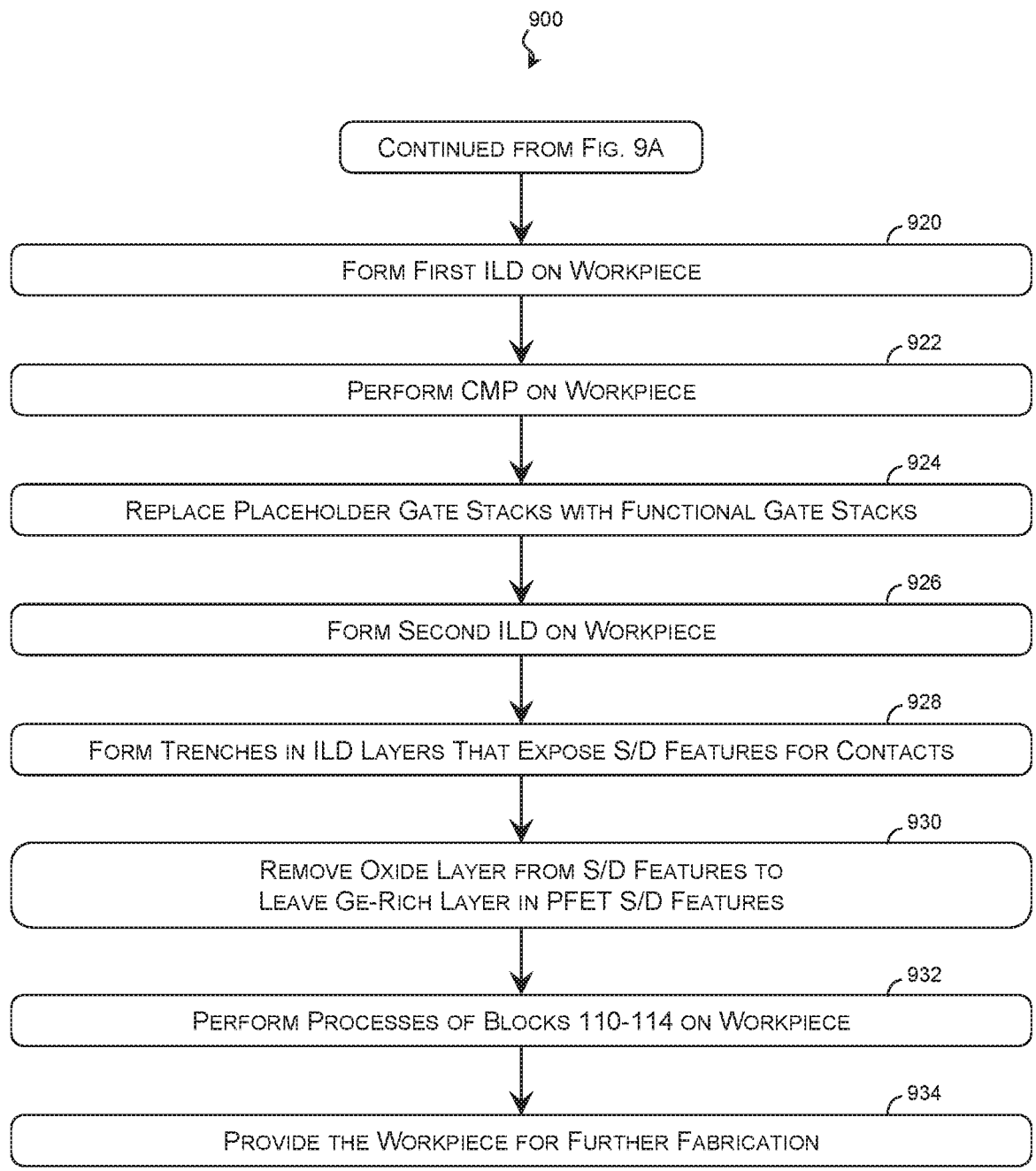

The above examples perform the oxidation of block 106 after the opening of the contact trenches. In further examples, oxidation is performed earlier, after forming the source/drain features. Some such examples are described with reference to FIGS. 9A-22. FIGS. 9A-9B are flow diagrams of a method 900 of fabricating a workpiece with a source/drain interface according to various aspects of the present disclosure. Additional steps can be provided before, during, and after the method 900, and some of the steps described can be replaced or eliminated for other embodiments of the method 900.

FIGS. 10-22 are cross-sectional diagrams of the workpiece 1000, taken along a fin-length direction, at points in the method 900 of fabrication according to various aspects of the present disclosure. FIGS. 10-22 have been simplified for the sake of clarity and to better illustrate the concepts of the present disclosure. Additional features may be incorporated into the workpiece 1000, and some of the features described below may be replaced or eliminated for other embodiments of the workpiece 1000.

Figure 10:
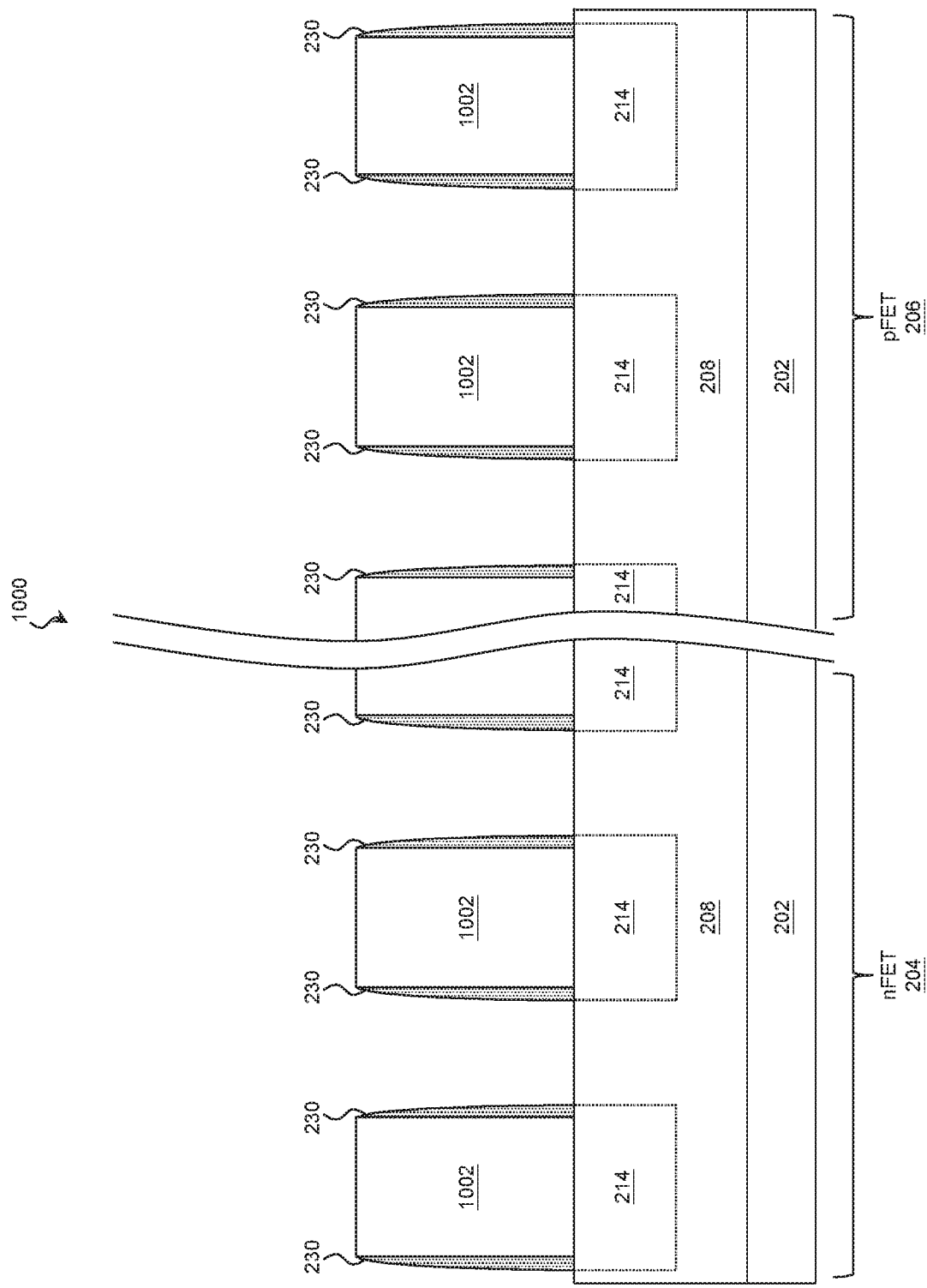
FIGS. 10-22 are cross-sectional diagrams of a workpiece, taken along a fin-length direction, at points in a method of fabrication according to various aspects of the present disclosure.
Figure 11:
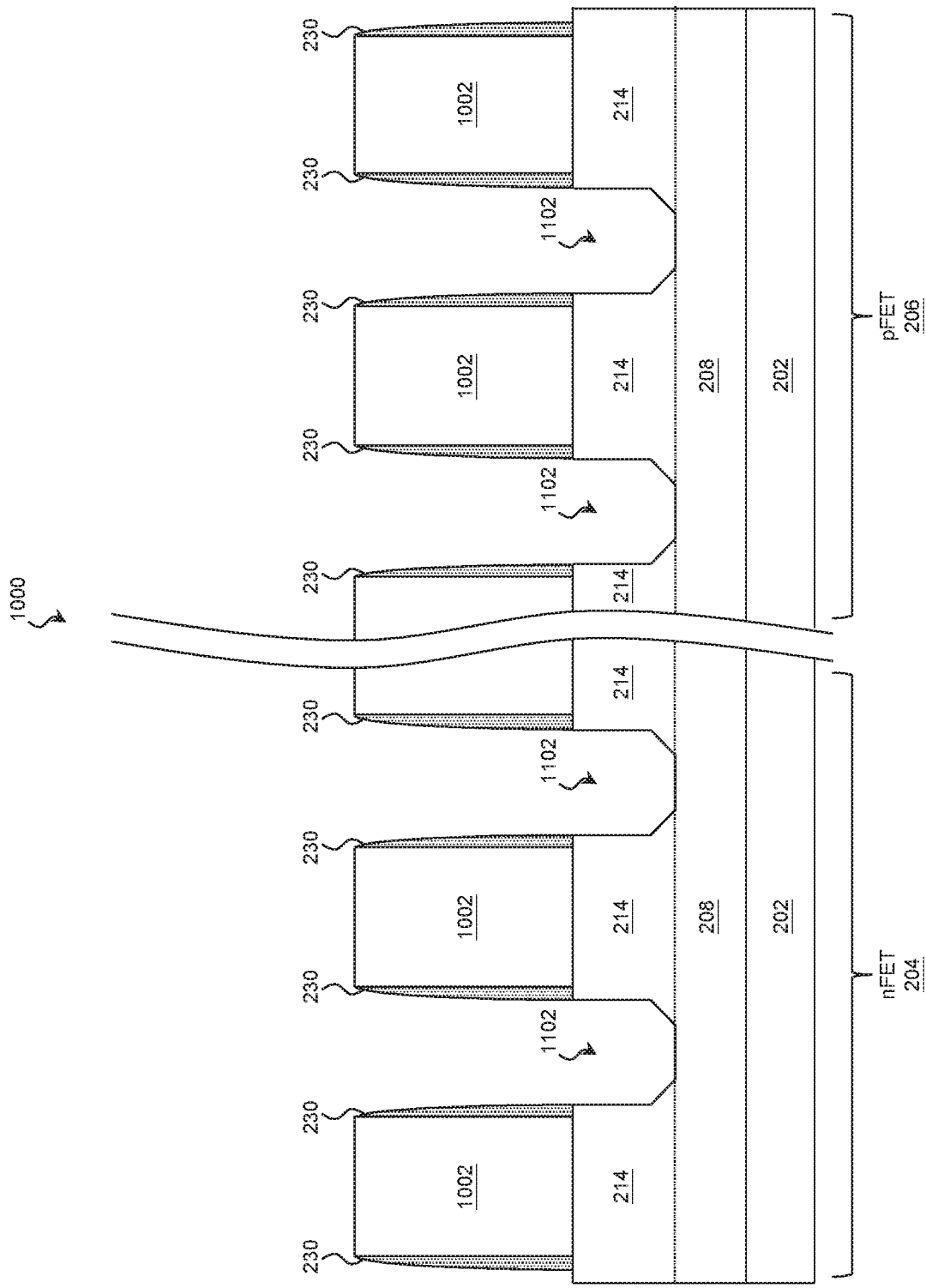
Figure 12:
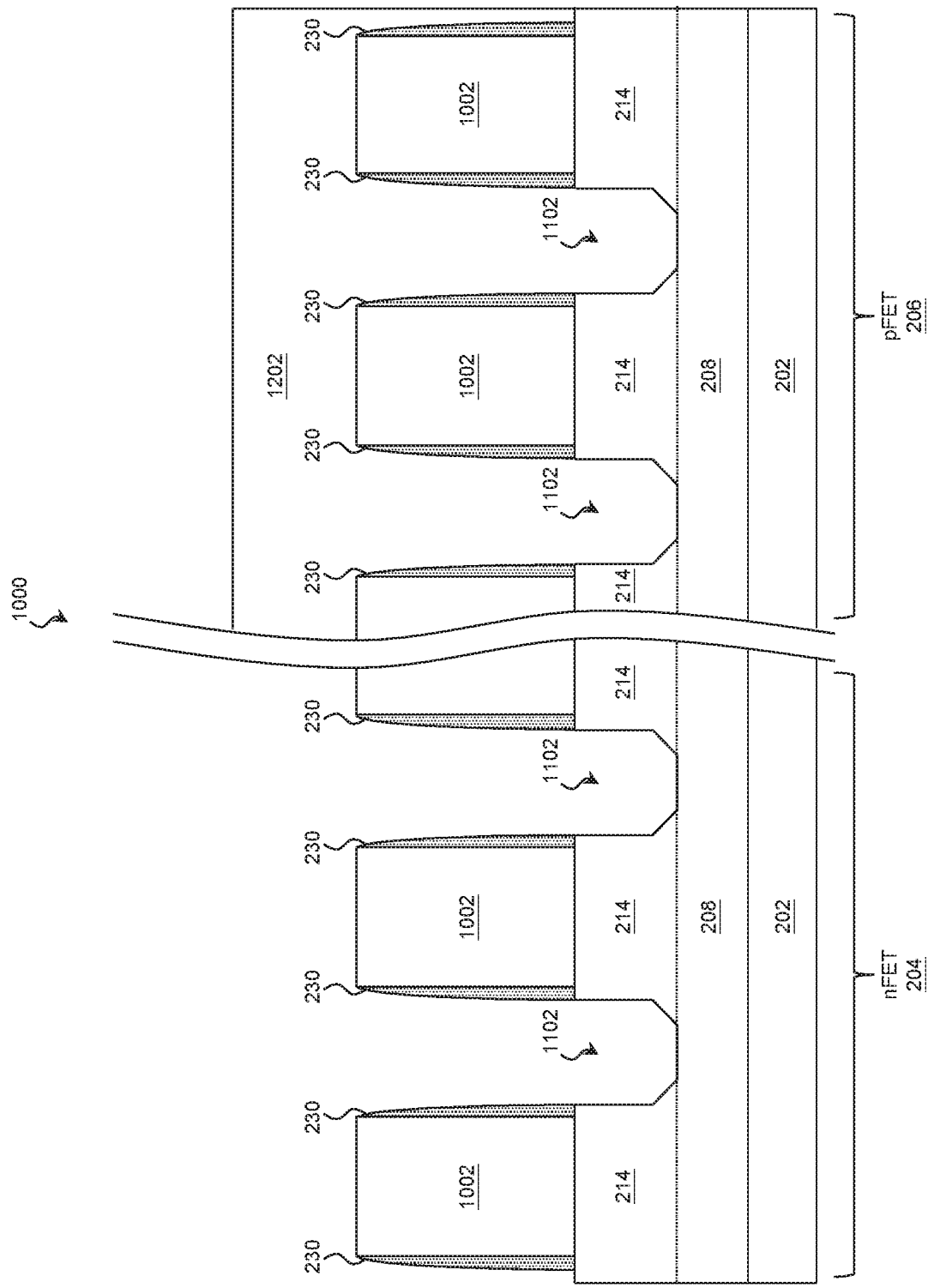

Referring to block 902 of FIG. 9A and to FIG. 10, the workpiece 1000 is received. At least some portions of the workpiece 1000, such as the substrate 202, device fins 208, channel regions 214, and sidewall spacers 230, may be substantially similar to those described above. The workpiece 1000 may further include gate stacks 1002 disposed on the channel regions 214 of the fins 208. In some examples, the gate stacks 1002 are functional gate structures. However, when materials of the functional gate structure are sensitive to fabrication processes or are difficult to pattern, a placeholder gate of polysilicon, dielectric, and/or other resilient material may be used during some of the fabrication processes. The placeholder gate is later removed and replaced with elements of a functional gate (e.g., a gate electrode, a gate dielectric layer, an interfacial layer, etc.) in a gate-last process. In such examples, the gate stacks 1002 represent placeholder gates.

To form the source/drain features on opposing sides of the channel regions 214, portions of the fins 208 may be etched and the source/drain features may be epitaxially grown in the resulting recesses. Referring to block 904 of FIG. 9A and to FIG. 11, an etching process is performed on the workpiece 1000 to create source/drain recesses 1102. In some examples, this includes forming a photoresist on the workpiece 1000 and patterning the photoresist in a photolithographic process to expose only those portions of the workpiece 1000 to be etched.

The etching processes itself may include any suitable etching technique such as wet etching, dry etching, Reactive Ion Etching (RIE), ashing, and/or other etching methods. In some embodiments, the etching process includes dry etching using an oxygen-based etchant, a fluorine-based etchant (e.g., $CF_4$, $SF_6$, $CH_2F_2$, $CHF_3$, and/or $C_2F_6$), a chlorine-based etchant (e.g., $Cl_2$, $CHCl_3$, $CCl_4$, and/or $BCl_3$), a bromine-based etchant (e.g., HBr and/or $CHBR_3$), an iodine-based etchant, other suitable etchant gases or plasmas, and/or combinations thereof. In some embodiments, the etching process includes wet etching using diluted hydrofluoric acid (DHF), potassium hydroxide (KOH) solution, ammonia, hydrofluoric acid (HF), nitric acid ($HNO_3$), acetic acid ($CH_3COOH$), and/or other suitable wet etchant(s). In some examples, the etchant is selected to etch the fins 208 without significantly etching surrounding structures such as the gate stacks 1002 and/or sidewall spacers 230. This may allow the etching to be performed even if the patterned photoresist is not perfectly aligned.

Any remaining photoresist may be removed after the etching.

Source/drain features may be formed in the nFET region 204 and the pFET region 206 in any order. In an example, source/drain features are formed in the nFET region 204 first. Referring to block 906 of FIG. 9A and to FIG. 12, a photoresist 1202 is formed on the workpiece 1000 and is patterned in a photolithographic process to expose the nFET region 204.

Figure 13:
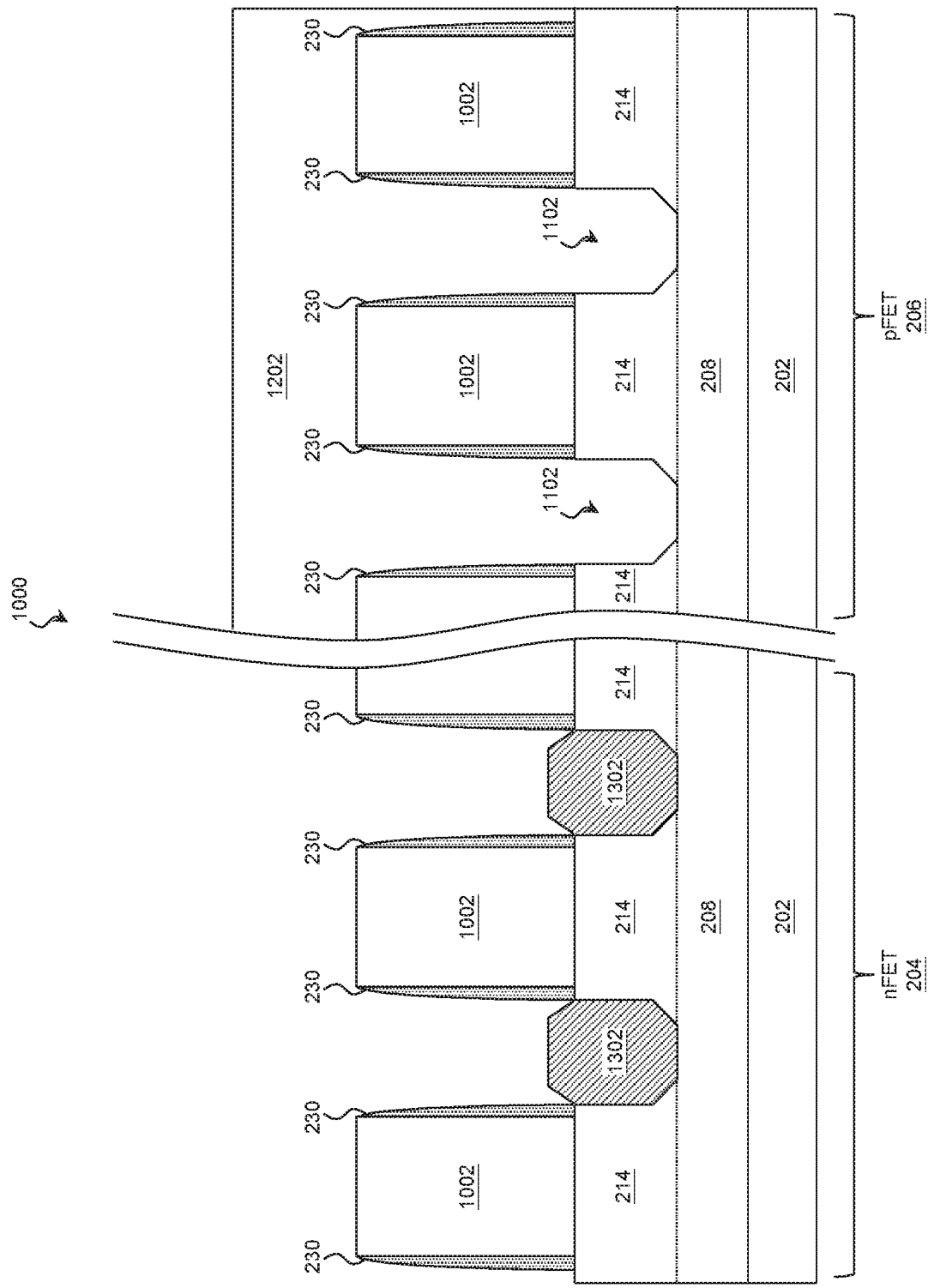

Referring to block 908 of FIG. 9A and to FIG. 13, nFET source/drain features 1302 are formed within the source/drain recesses 1102 in the nFET region 204. The nFET source/drain features 1302 may also extend out of the source/drain recesses 1102 to a height above the fins 208. The source/drain features 1302 may be substantially similar to the nFET source/drain features 210 above, and in various examples, the nFET source/drain features 1302 are formed by a Chemical Vapor Deposition (CVD) deposition technique (e.g., Vapor-Phase Epitaxy (VPE) and/or Ultra-High Vacuum CVD (UHV-CVD)), molecular beam epitaxy, and/or other suitable processes. The epitaxy process may use gaseous and/or liquid precursors, which interact with a component of the fins 208 (e.g., silicon or silicon-germanium) to form the nFET source/drain features 1302. The semiconductor component of the source/drain features 1302 may be similar to or different from the remainder of the fin 208. For example, Si-containing source/drain features 1302 may be formed on a SiGe-containing fin 208 or vice versa. When the source/drain features 1302 and fins 208 contain more than one semiconductor, the ratios may be substantially similar or different.

The source/drain features 1302 may be in-situ doped to include n-type dopants, such as phosphorus or arsenic, and/or other suitable dopants including combinations thereof. Additionally or in the alternative, the source/drain features 1302 may be doped using an implantation process (i.e., a junction implant process) after the source/drain features 1302 are formed. In various examples, the doped source/drain features 1302 include SiP, SiCP, and/or SiAs.

Any remaining photoresist 1202 may be removed after the source/drain features 1302 are formed.

Figure 14:
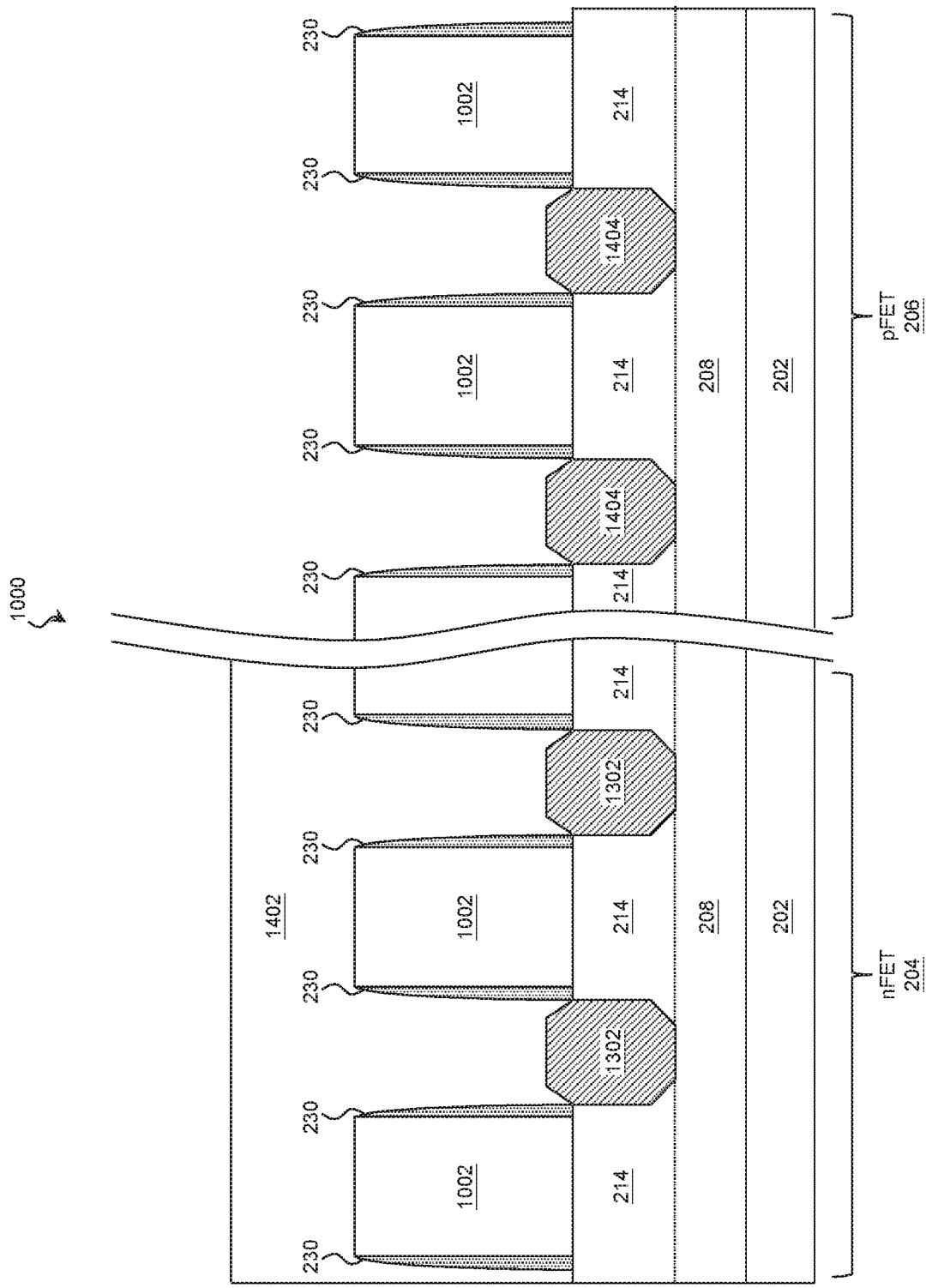

Referring to block 910 of FIG. 9A and to FIG. 14, a photoresist 1402 is formed on the workpiece 1000 and is patterned to expose the pFET region 206. Referring to block 912 of FIG. 9A and referring still to FIG. 14, pFET source/drain features 1404 are formed within the source/drain recesses 1102 in the pFET region 206. The source/drain features 1404 may also extend out of the source/drain recesses 1102 to a height above the fins 208. The source/drain features 1404 may be substantially similar to the pFET source/drain features 212 above, and may be formed by a CVD deposition technique, molecular beam epitaxy, and/or other suitable processes. The semiconductor component of the source/drain features 1404 may be similar to or different from the remainder of the fin 208.

The pFET source/drain features 1404 may be in-situ doped to include p-type dopants, such as boron, $BF_2$, or indium; and/or other suitable dopants including combinations thereof. Additionally or in the alternative, the source/drain features 1404 may be doped using an implantation process (i.e., a junction implant process) after the source/drain features 1404 are formed. In various examples, the pFET source/drain features 1404 include SiGeB, and/or SiGeIn, with a relatively high concentration of Ge relative to Si (e.g., excluding dopants, a concentration of Ge greater than about 50 atomic percent).

Any remaining photoresist 1402 may be removed after the source/drain features 1404 are formed.

Figure 15:
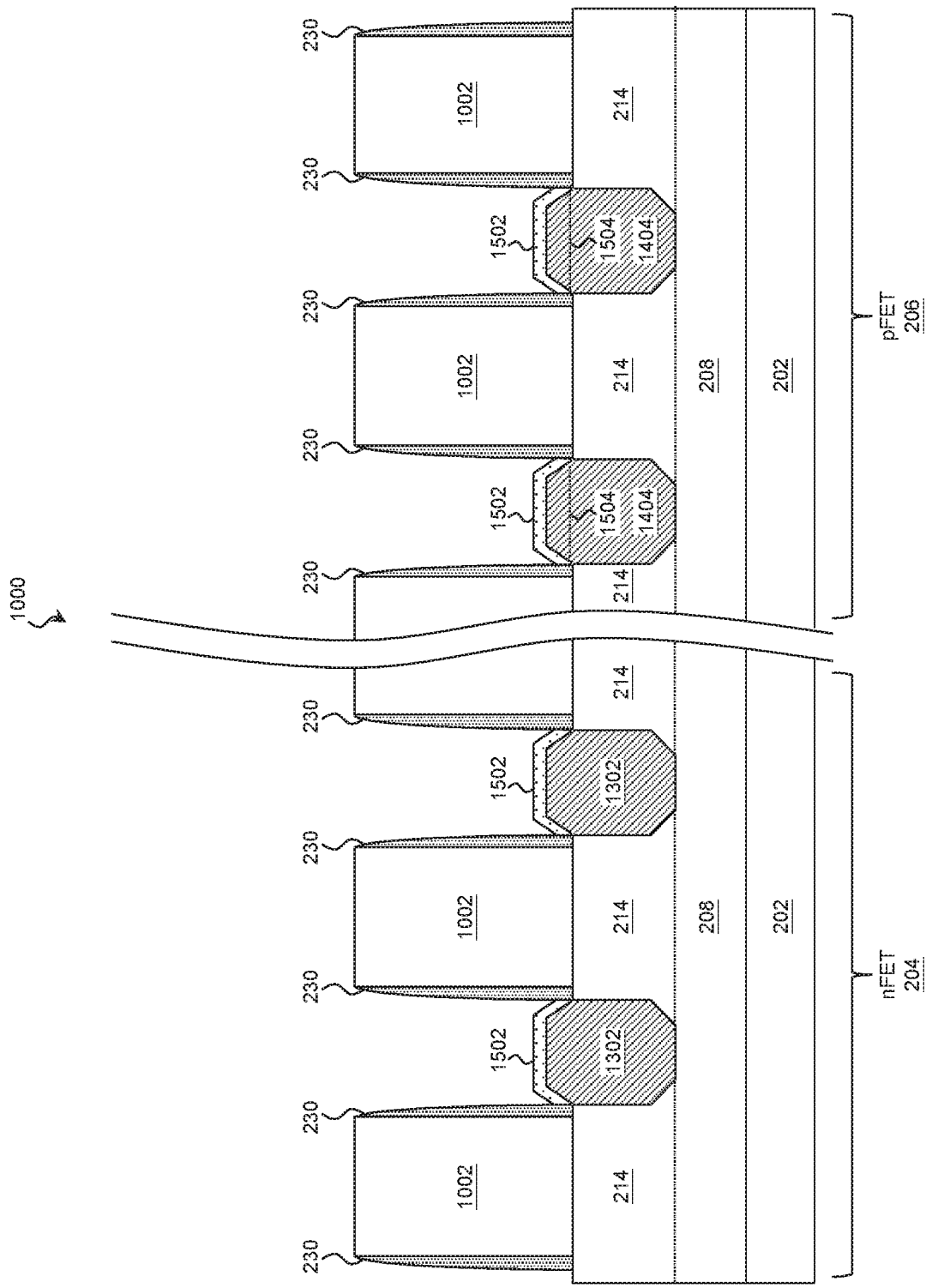

Referring to block 914 of FIG. 9A and to FIG. 15, an oxidation process is performed on the workpiece 1000. The oxidation process may be substantially similar to that of block 106 of FIG. 1 and is configured to introduce oxygen into at least the pFET source/drain features 1404 within the pFET region 206. In some examples, the oxidation process further introduces oxygen into the nFET source/drain features 1302 of the nFET region 204. In some examples, a patterned photoresist layer is used to cover and protect the source/drain features 1302 of the nFET region 204 to prevent oxidation of the source/drain features 1302.

The oxidation process may include any suitable oxidizing technique including dry ($O_2$) and/or wet ($H_2O$) oxidation techniques. In some examples, the oxidation process includes heating the workpiece 1000 to temperature between about 250° C. and about 700° C. at a pressure between about 0.1 Torr and about $8 \times 10^5$ Torr and introducing an oxygen source such as $O_2$ or $H_2O$. The oxidation process may be performed for any suitable duration and, in various examples, is performed for between about 10 minutes and about 24 hours.

In examples where the primarily silicon nFET source/drain features 1302 are oxidized, the oxidation process may create a layer 1502 of $SiO_X$ on the surface of the source/drain features 1302. Because silicon oxidizes more readily than germanium, an oxidation process may draw silicon out of a silicon-germanium semiconductor to form a layer of predominantly silicon oxide at the surface. In such examples and others, the oxidation process of block 914 creates the layer 1502 of $SiO_X$ on the surface of the SiGe pFET source/drain features 1404 as the process is configured to substantially avoid oxidation of the Ge within the source/drain features 1404.

As a result of drawing out the silicon from a portion of the pFET source/drain features 1404, the oxidation process may form a Ge-rich layer 1504 containing the remaining germanium just under the $SiO_X$ layer 1502. The Ge-rich layer 1504 has a higher concentration of Ge relative to Si than the remainder of the source/drain feature 1404. In various examples, excluding dopants, the Ge-rich layer 1504 contains between about 10 atomic percent and about 100 atomic percent Ge. In some such examples, the Ge-rich layer 1504 contains only Ge and dopants.

The $SiO_X$ layer 1502 and Ge-rich layer 1504 may be formed to have any suitable thickness, and in various examples, each has a thickness between about 1 nm and about 10 nm. The $SiO_X$ layer 1502 may be substantially conformal and may follow the contour of the top of the source/drain features 1302 and 1404. In some such examples, the $SiO_X$ layer 1502 over a source/drain feature 1404 has side portions that slope upwards in a direction away from the sidewall spacers 230 and a central portion extending between the side portions that is substantially horizontal.

Referring to block 916 of FIG. 9A, a dopant activation process, such as Rapid Thermal Annealing (RTA) and/or a laser annealing process, may be performed on the workpiece 1000 to activate the dopants within the source/drain features 1302 and 1404.

Figure 16:
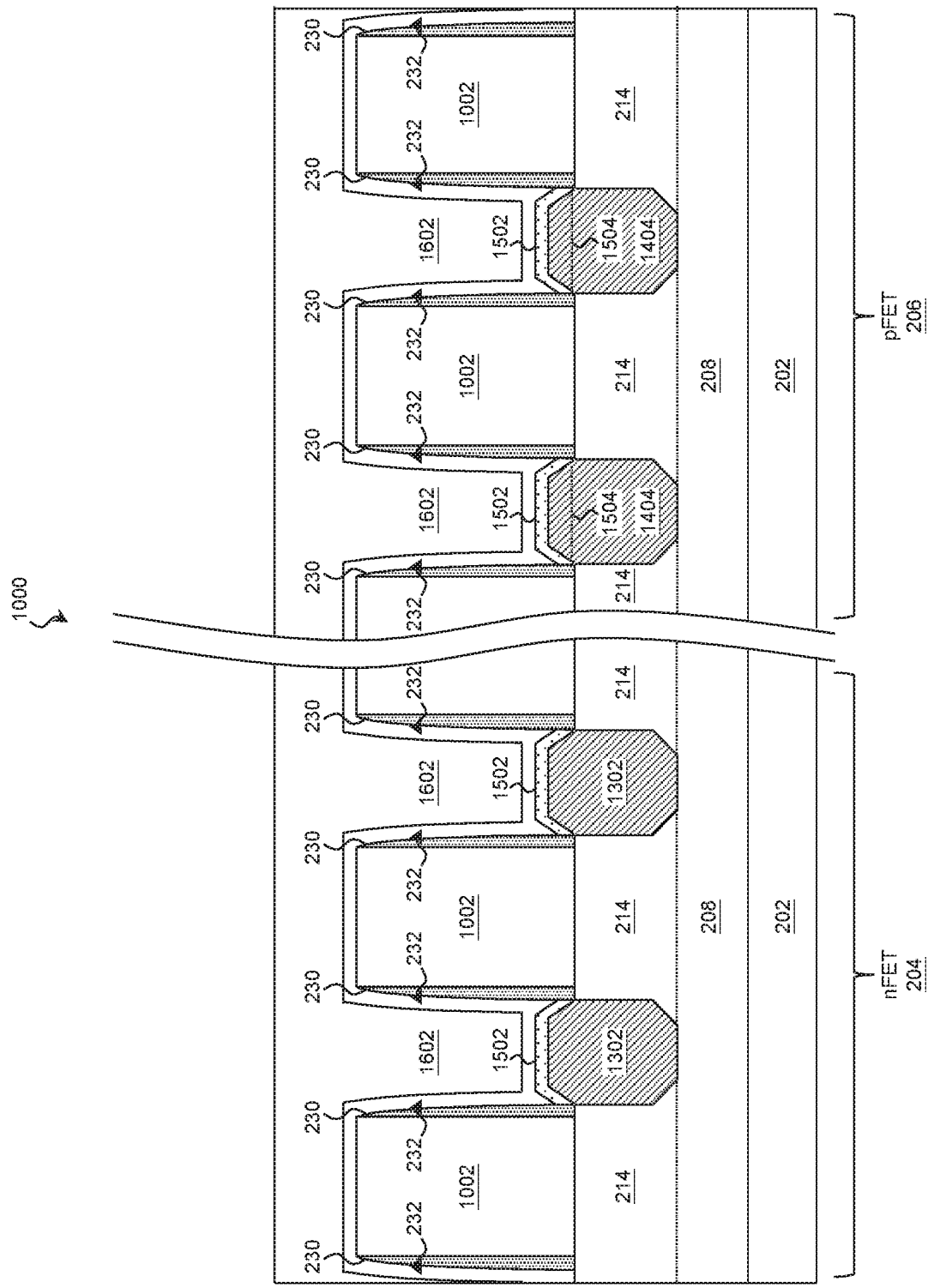

Referring to block 918 of FIG. 9A and to FIG. 16, a contact-etch stop layer (CESL) 232 may be formed on the $SiO_X$ layer 1502, on the source/drain features 1302 and 1404, and along the top and sides of the gate stacks 1002. The CESL 232 may be substantially similar to that described above and may be deposited by any suitable technique including ALD, CVD, High-Density Plasma CVD (HDP-CVD), and/or other suitable techniques and may be formed to any suitable thickness. In some examples, the CESL 232 has a thickness between about 1 nm and about 50 nm.

Referring to block 920 of FIG. 9B and referring still to FIG. 16, a first Inter-Level Dielectric (ILD) layer 1602 is formed on the workpiece 1000. The first ILD layer 1602 may be substantially similar to that described above and may be formed by any suitable process including CVD, PVD, spin-on deposition, and/or other suitable processes.

Figure 17:
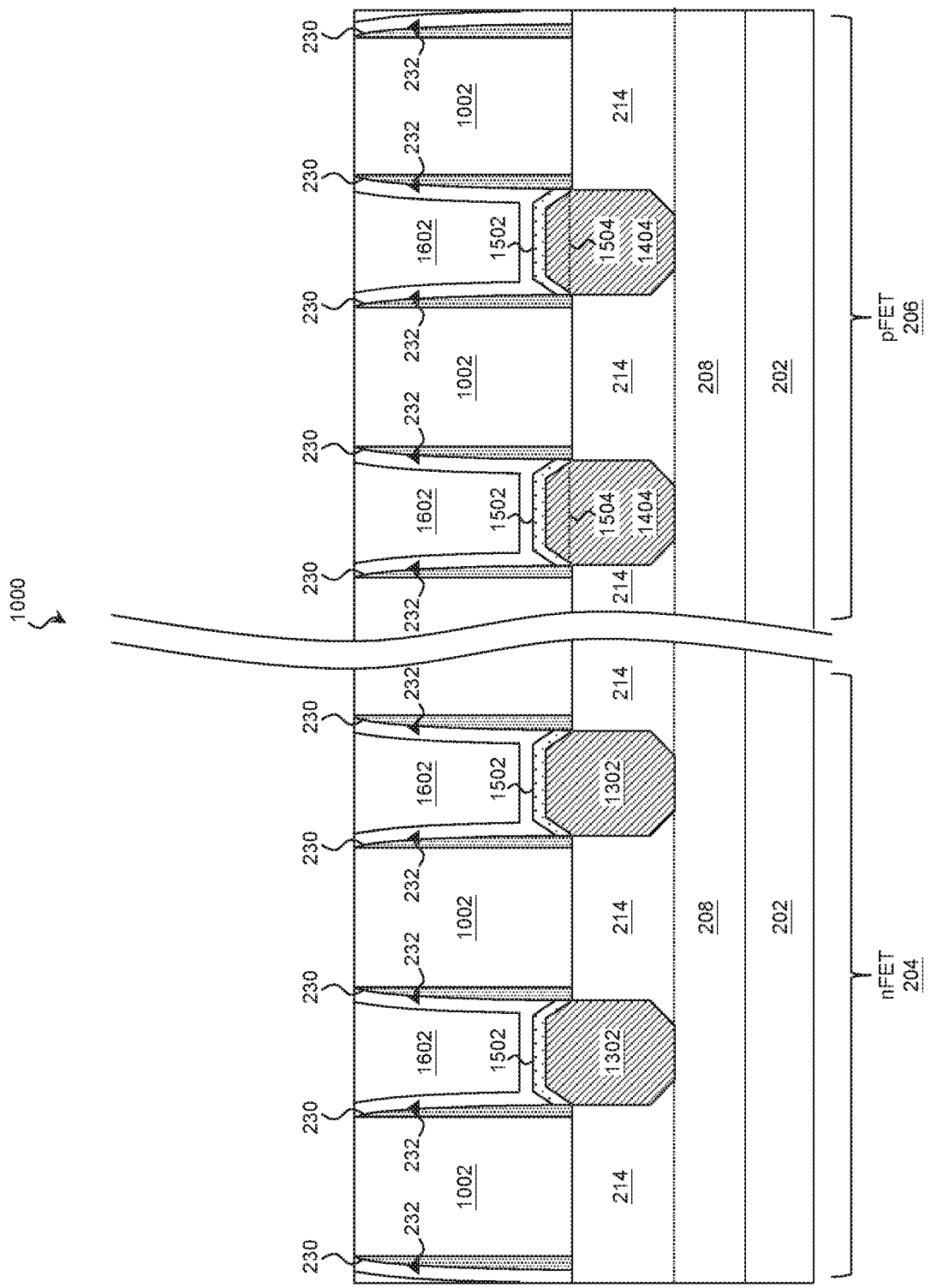

Referring to block 922 of FIG. 9B and to FIG. 17, a chemical mechanical polish/planarization (CMP) process is performed on the workpiece 1000 to remove the first ILD layer 1602 and/or the CESL 232 from the top of the placeholder gate stacks 1002. The CMP process may be followed by an etch back process to remove any remaining ILD layer 1602 material or CESL 232 material from the placeholder gate stacks 1002.

Figure 18:
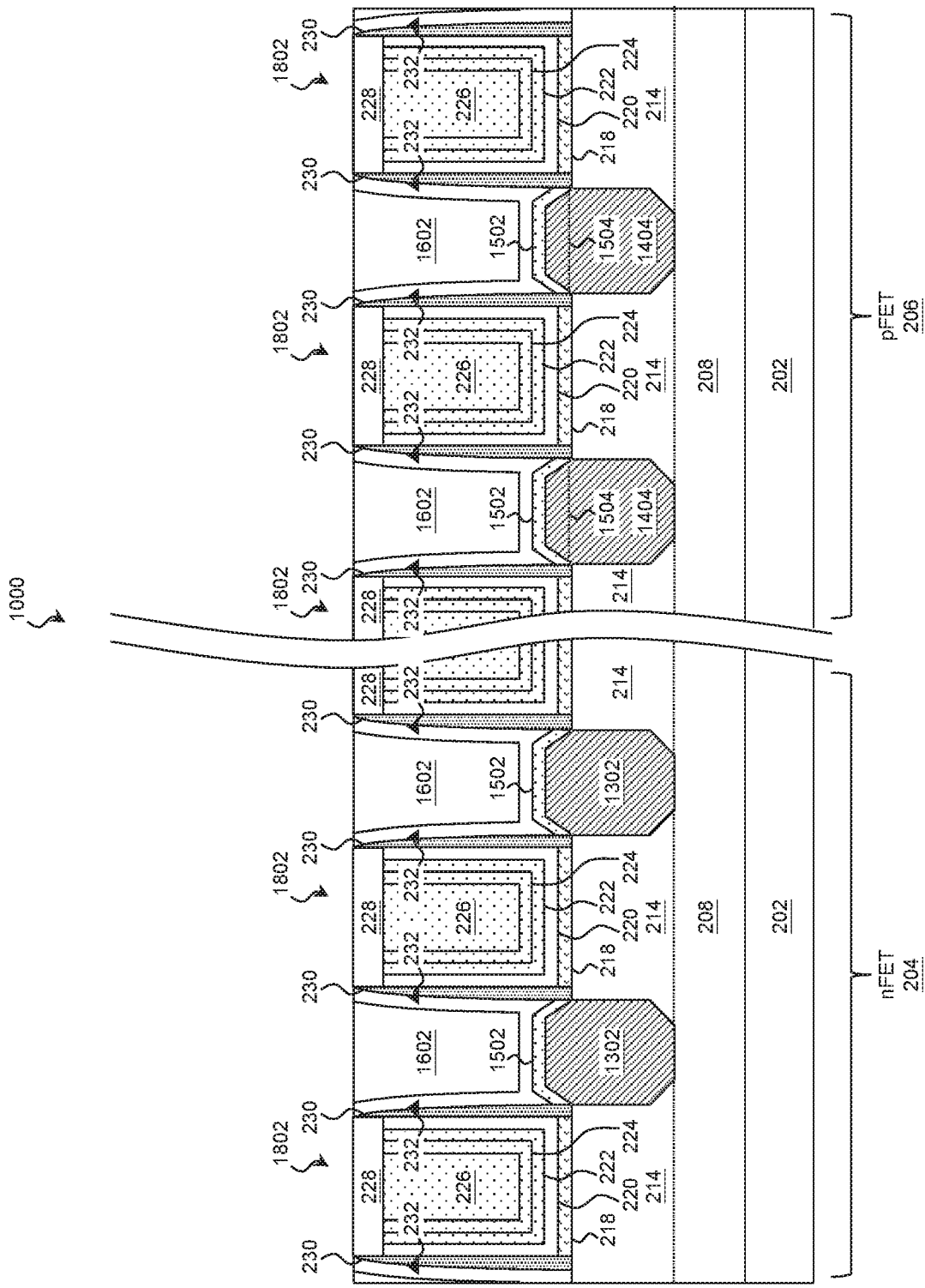

Referring to block 924 of FIG. 9B and to FIG. 18, the placeholder gate stacks 1002 are removed and replaced with functional gate stacks 1802. The materials of the placeholder gate stacks 1002 may be removed by one or more etching processes (e.g., wet etching, dry etching, RIE) using etchants configured to selectively etch the materials of the placeholder gate stacks 1002 without significant etching of the surrounding materials, such as the fins 208, the sidewall spacers 230, the CESL 232, the first ILD layer 1602, etc.

The functional gate stacks 1802 are then formed in recesses defined by removing the placeholder gate stacks 1002. The functional gate stacks 1802 may be substantially similar to those described above and may include layers such as an interfacial layer 218, a gate dielectric 220, a capping layer 222, work function layer(s) 224, electrode fill 226, and/or a gate cap 228, each substantially as described above.

Figure 19:
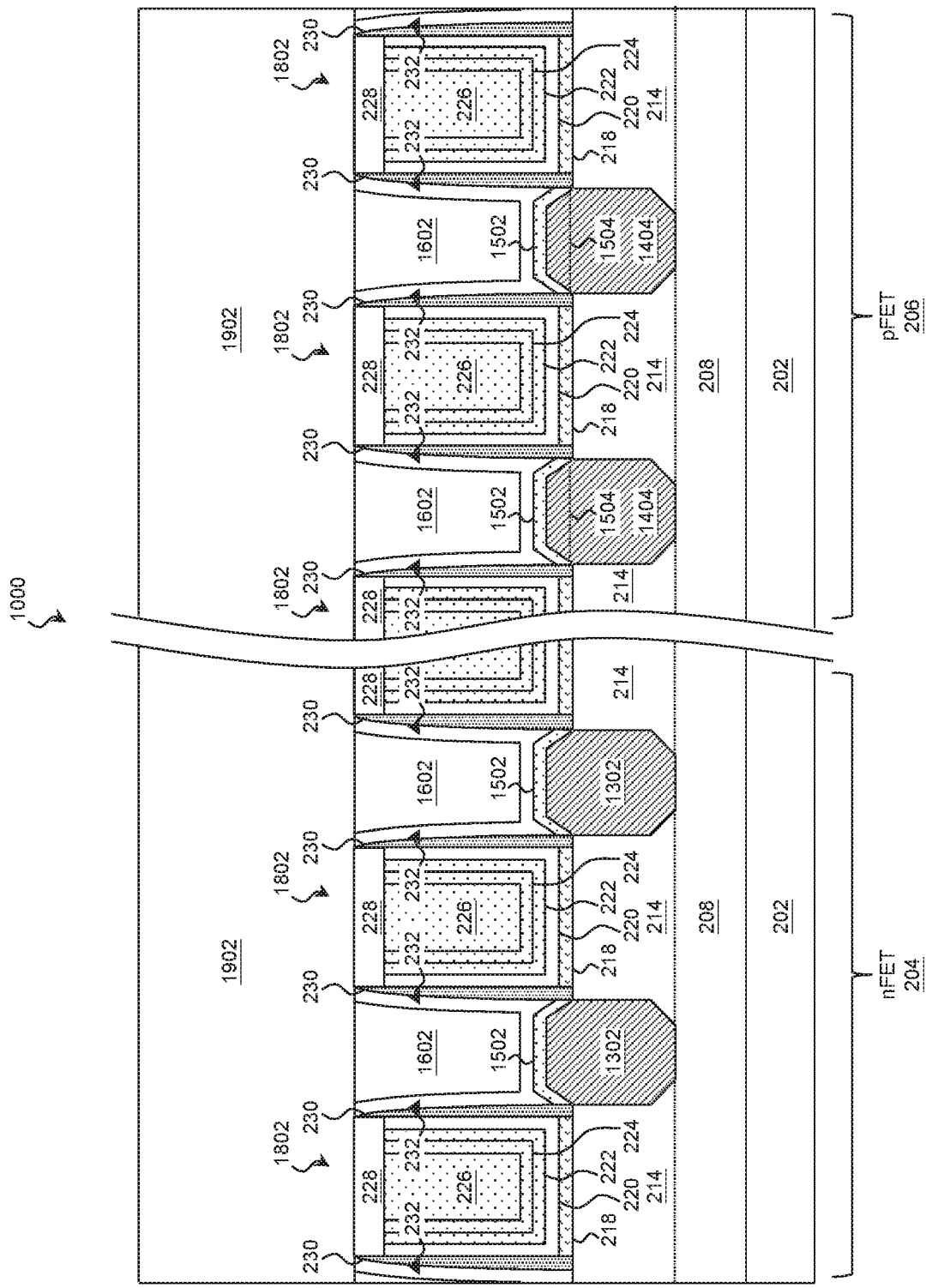

Referring to block 926 of FIG. 9B and to FIG. 19, a second ILD layer 1902 may be formed on the existing ILD layer 1602 and on the functional gate stacks 1802. This may be performed substantially as described in block 920, and the second ILD layer 1902 may be substantially similar to the first ILD layer 1602.

Figure 20:
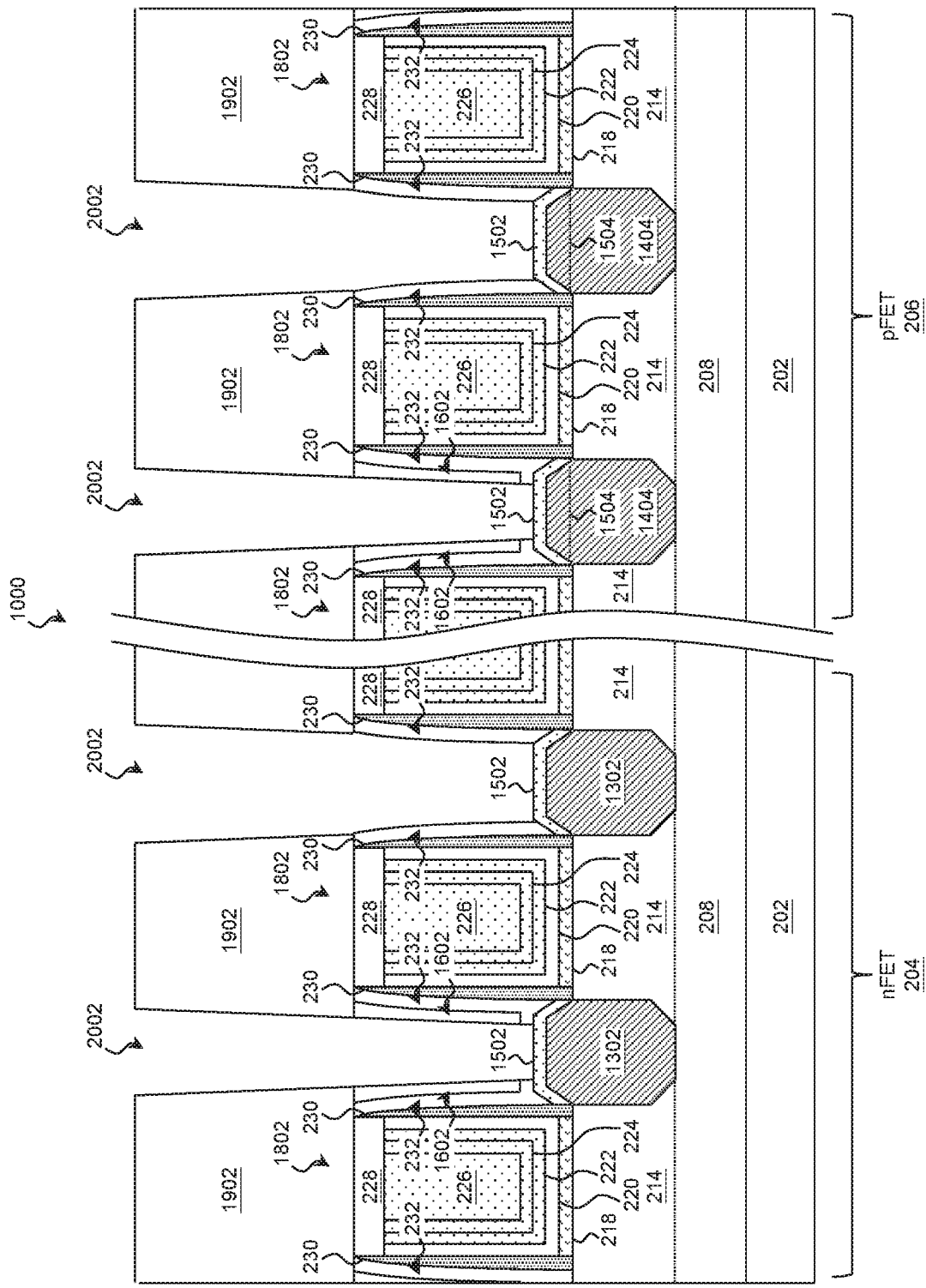
Figure 21:
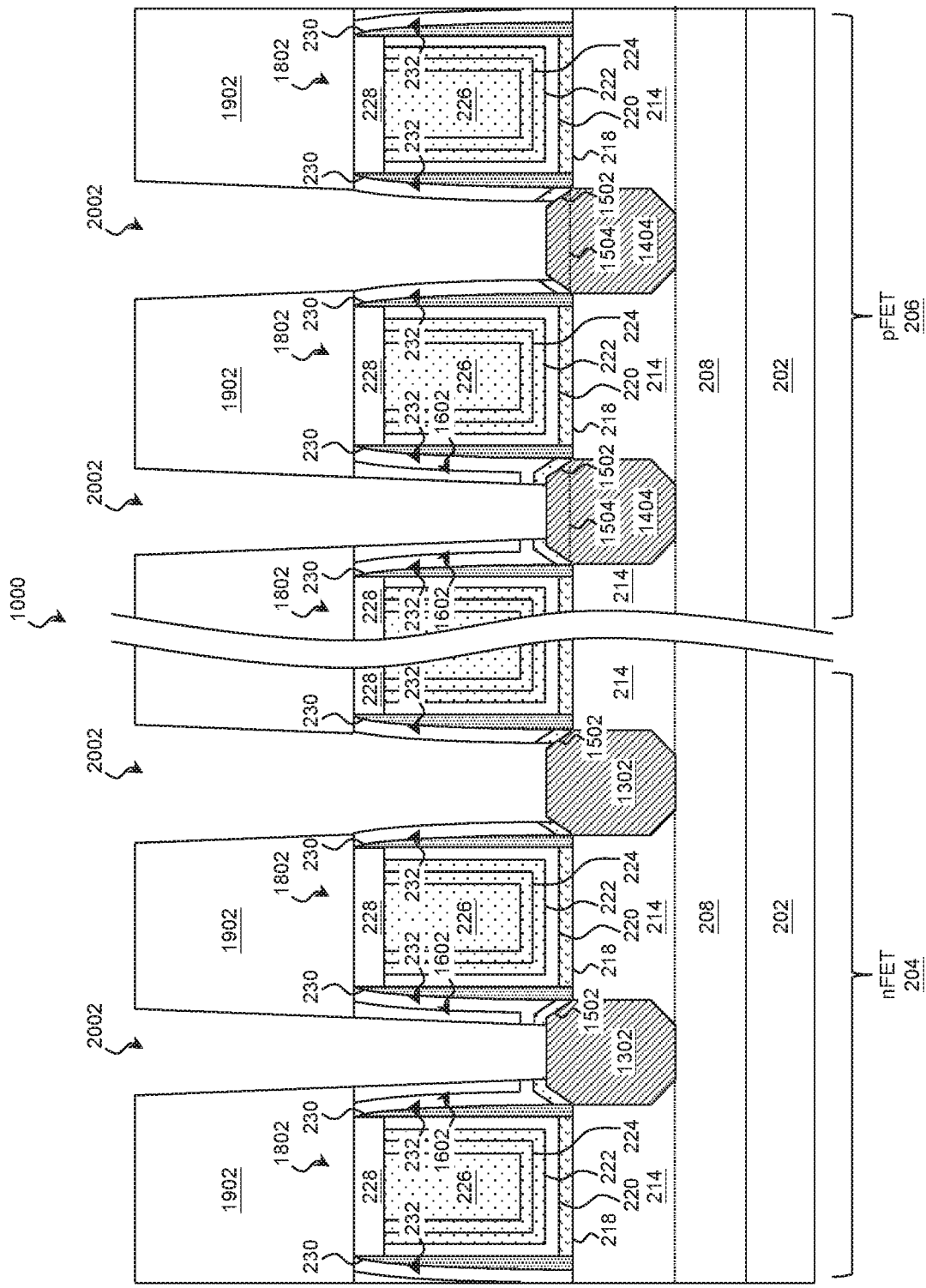

Referring to block 928 of FIG. 9B and to FIG. 20, trenches 2002 are formed in the ILD layers 1602 and 1902 for source/drain contacts. The trenches 2002 expose the source/drain features 1302 and 1404 at locations where conductive features of the interconnect are to be formed. This may be performed substantially as described in block 104 of FIG. 1. In some examples, a patterned photoresist is formed on the workpiece 1000 that selectively exposes portions the ILD layers 1602 and 1902 to etch. The exposed portions of the ILD layers 1602 and 1902 are then etched as described above.

The trenches 2002 may expose may expose the $SiO_X$ layers 1502 of the source/drain features 1302 and 1404 in whole or in part. Referring to block 930 of FIG. 9B and to FIG. 21, the exposed portions of the $SiO_X$ layers 1502 are removed in a precleaning process that is configured to avoid significant removal of the Ge-rich layer 1504. This may be performed substantially as described in block 108 of FIG. 1, and may include a dry cleaning process, a wet cleaning process, RIE, and/or other suitable cleaning methods. The precleaning process may leave some of the sloping side portions of the $SiO_X$ layers 1502 and some of the horizontal central portion of the $SiO_X$ layers 1502 depending on the width of the trench and the subsequent contact to be formed.

Figure 22:
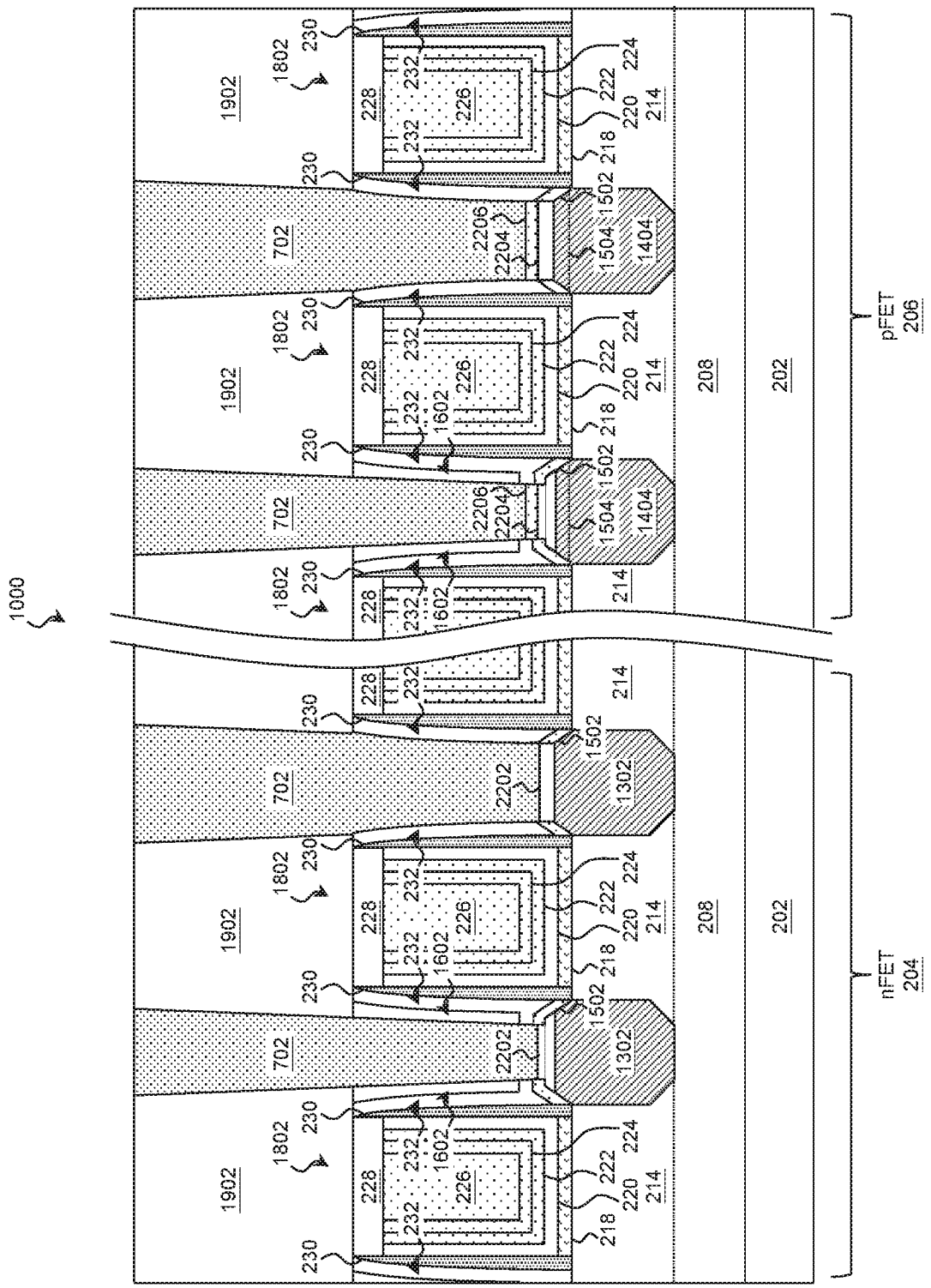

Referring to block 932 of FIG. 9B and to FIG. 22, the processes of blocks 110-114 of FIG. 1 are performed on the workpiece 1000. This may include performing a silicide/germanide forming process as described in block 110 to form a silicide layer 2202 on the silicon-containing source/drain features 1302 in the nFET region 204, and a germanide layer 2204 and a nitridized germanide cap 2206 on the SiGE-containing source/drain features 1404 in the pFET region 206. In various examples, the silicide layer 2202 has a thickness between about 1 nm and about 1 nn, the remaining Ge-rich layer 1504 has a thickness of less than about 2 nm, the germanide layer 2204 has a thickness between about 2 nm and about 5 nm, and the nitridized germanide cap 2206 has a thickness between about 1 nm and about 3 nm. In various examples, the nitridized germanide cap 2206 has a nitrogen concentration between about 15 and about 40 atomic percent.

Source/drain contacts 702 may be formed in the trenches 2002 that extend through the remaining $SiO_X$ layers 1502 to couple to the source/drain features 1302 and 1404 as described in block 112. In particular, the contacts 702 may physically and electrically couple to the silicide layer 2202 of the nFET source/drain features 1302 and to the germanide layer 2204 and/or nitridized germanide cap 2206 of the pFET source/drain features 1404. The contacts 702 may be substantially as described above and may include one or more layers of conductive materials such as metals, metal oxides, metal nitrides, and/or combinations thereof.

A planarization process may be performed to remove portions of the contact material that are above the ILD layers 1602 and 1902 as described in block 114.

Referring to block 934 of FIG. 9B, the workpiece 1000 is provided for further fabrication. In various examples, this includes forming a remainder of an electrical interconnect structure, dicing, packaging, and other fabrication processes.

Thus, the present disclosure provides examples of an integrated circuit with an improved interface between a source/drain feature and a source/drain contact and examples of a method for forming the integrated circuit. In some embodiments, the method includes receiving a substrate having a source/drain feature disposed on the substrate. The source/drain feature includes a first semiconductor element and a second semiconductor element. The first semiconductor element of the source/drain feature is oxidized to produce an oxide of the first semiconductor element on the source/drain feature and a region of the source/drain feature with a greater concentration of the second semiconductor element than a remainder of the source/drain feature. The oxide of the first semiconductor element is removed, and a contact is formed that is electrically coupled to the source/drain feature. In some such embodiments, the first semiconductor element includes silicon and the second semiconductor element includes germanium. In some such embodiments, metal is introduced into the region of the source/drain feature to form a germanide layer of the source/drain feature. In some such embodiments, nitrogen is introduced into the germanide layer to form a nitridized cap layer on a remainder of the germanide layer, and the contact physically couples to the nitridized cap layer. In some such embodiments, the region of the source/drain feature is substantially free of the first semiconductor element. In some such embodiments, the source/drain feature is a pFET source/drain feature, and the substrate further has an nFET source/drain feature disposed on the substrate. The nFET source/drain feature includes the first semiconductor element. The oxidizing of the first semiconductor element of the pFET source/drain feature further forms the oxide of the first semiconductor element on the nFET source/drain feature, and the removing of the oxide removes the oxide from the pFET source/drain feature and the nFET source/drain feature. In some such embodiments, the nFET source/drain feature is substantially free of the second semiconductor element. In some such embodiments, the substrate further includes an inter-level dielectric disposed on the source/drain feature, and a recess is formed in the inter-level dielectric that exposes the source/drain feature. The oxidizing and the removing of the oxide are performed through the recess. In some such embodiments, the contact is formed in the recess.

In further embodiments, a substrate is received having an nFET region with an nFET source/drain feature and a pFET region with a pFET source/drain feature. The pFET source/drain feature includes a first semiconductor material and a second semiconductor material. An oxidation process is performed on the nFET source/drain feature and the pFET source/drain feature to form an oxide layer on the nFET source/drain feature and on the pFET source/drain feature. The oxidation process further forms a region of the pFET source/drain feature with a greater concentration of the second semiconductor material than a remainder of the pFET source/drain feature. The oxide layer is removed from the nFET source/drain feature and from the pFET source/drain feature. A first contact is formed electrically coupled to the nFET source/drain feature and a second contact is formed electrically coupled to the pFET source/drain feature. In some such embodiments, the first semiconductor material includes silicon and the second semiconductor material includes germanium. In some such embodiments, the nFET source/drain feature is substantially free of germanium. In some such embodiments, a germanide layer is formed from the region of the pFET source/drain feature with the greater concentration of the second semiconductor material. In some such embodiments, the region of the pFET source/drain feature is substantially free of the first semiconductor material. In some such embodiments, the substrate further includes an inter-level dielectric disposed on the nFET source/drain feature and on the pFET source/drain feature. A first recess is formed in the inter-level dielectric that exposes the nFET source/drain feature, and a second recess is formed in the inter-level dielectric that exposes the pFET source/drain feature. The performing of the oxidation process and the removing of the oxide layer are performed through the first recess and the second recess.

In yet further embodiments, a substrate is received having a fin disposed on the substrate. A SiGe source/drain feature is formed on the fin. A top surface of the SiGe source/drain feature is oxidized to form an oxide layer on the SiGe source/drain feature and a region of the SiGe source/drain feature with a greater concentration of Ge than a remainder of the SiGe source/drain feature. The oxide layer is removed from the SiGe source/drain feature, and a contact is formed that couples to the SiGe source/drain feature. In some such embodiments, the region of the SiGe source/drain feature is substantially free of silicon. In some such embodiments, a metal is introduced into the region of the SiGe source/drain feature to form a germanide layer. In some such embodiments, nitrogen is introduced into the germanide layer to form a nitridized cap layer on the germanide layer. In some such embodiments, an inter-level dielectric is formed on the inter-level dielectric after the oxidizing of the top surface and prior to the removing of the oxide layer.

In further embodiments, a device includes a substrate having a fin extending from a remainder of the substrate, a source/drain feature disposed on the fin, and a contact coupling to the source/drain feature. The source/drain feature includes a SiGe semiconductor, and a top portion of the source/drain feature has a different germanium concentration than a bottom portion of the source/drain feature. In some such embodiments, the device also includes a dielectric layer that includes silicon oxide disposed on the top portion of the source/drain feature. The contact extends through the dielectric layer. In some such embodiments, the device also includes an etch stop layer disposed on the dielectric layer, and the contact extends through the etch stop layer. In some such embodiments, the dielectric layer includes a side portion that slopes upward and a horizontal central portion extending from the side portion that physically contacts the contact.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   receiving a substrate having a first source/drain feature and a second source/drain feature disposed thereupon, wherein the first source/drain feature includes a first semiconductor element and a second semiconductor element and the second source/drain feature includes the first semiconductor element, wherein the first source/drain feature is part of a first transistor having a first conductivity type and the second source/drain feature is part of a second transistor having a second conductivity type that is opposite the first conductivity type;
   oxidizing the first semiconductor element of the first source/drain feature to produce an oxide layer that includes the first semiconductor element on the first source/drain feature and a region of the first source/drain feature with a greater concentration of the second semiconductor element than a remainder of the first source/drain feature, wherein the oxidizing of the first semiconductor element of the first source/drain feature further includes oxidizing of the first semiconductor element of the second source/drain feature to form the oxide layer on the second source/drain feature;
   removing the oxide layer from the first source/drain feature and the second source/drain feature; and
   forming a contact electrically coupled to the first source/drain feature.

2. The method of claim 1, wherein the first semiconductor element includes silicon and the second semiconductor element includes germanium.

3. The method of claim 2 further comprising introducing metal to the region of the first source/drain feature to form a germanide layer of the first source/drain feature.

4. The method of claim 3 further comprising introducing nitrogen to the germanide layer to form a nitridized cap layer on a remainder of the germanide layer, wherein the contact physically couples to the nitridized cap layer.

5. The method of claim 1, wherein the region of the first source/drain feature is substantially free of the first semiconductor element.

6. The method of claim 1, wherein the second source/drain feature is substantially free of the second semiconductor element.

7. The method of claim 1, wherein:
   the substrate further includes an inter-level dielectric disposed on the first source/drain feature;
   the method further comprises forming a recess in the inter-level dielectric that exposes the first source/drain feature; and
   the oxidizing and the removing of the oxide layer are performed through the recess.

8. The method of claim 7, wherein the contact is formed in the recess.

9. The method of claim 1, wherein the first conductivity type is p-type and the second conductivity type is n-type.

10. A method comprising:
    receiving a substrate having an nFET region with an nFET source/drain feature and a pFET region with a pFET source/drain feature, wherein the pFET source/drain feature includes a first semiconductor material and a second semiconductor material;
    performing an oxidation process on the nFET source/drain feature and the pFET source/drain feature to form an oxide layer on the nFET source/drain feature and on the pFET source/drain feature, wherein the oxidation process further forms a region of the pFET source/drain feature with a greater concentration of the second semiconductor material than a remainder of the pFET source/drain feature;
    removing the oxide layer from the nFET source/drain feature and from the pFET source/drain feature; and
    forming a first contact electrically coupled to the nFET source/drain feature and a second contact electrically coupled to the pFET source/drain feature.

11. The method of claim 10, wherein the first semiconductor material includes silicon and the second semiconductor material includes germanium.

12. The method of claim 11, wherein the nFET source/drain feature is substantially free of germanium.

13. The method of claim 11 further comprising forming a germanide layer from the region of the pFET source/drain feature with the greater concentration of the second semiconductor material.

14. The method of claim 10, wherein the region of the pFET source/drain feature is substantially free of the first semiconductor material.

15. The method of claim 10, wherein:
the substrate further includes an inter-level dielectric disposed on the nFET source/drain feature and on the pFET source/drain feature;
the method further comprises forming a first recess in the inter-level dielectric that exposes the nFET source/drain feature and a second recess in the inter-level dielectric that exposes the pFET source/drain feature; and
the performing of the oxidation process and the removing of the oxide layer are performed through the first recess and the second recess.

16. A method comprising:
receiving a substrate having a source/drain feature disposed thereupon, wherein the source/drain feature includes a first semiconductor element;
oxidizing the first semiconductor element of the source/drain feature to produce an oxide layer that includes the first semiconductor element on the source/drain feature;
removing a first portion of the oxide layer to expose a portion of the source/drain feature, wherein a second portion of the oxide layer remains disposed on the source/drain feature after the removing of the first portion of the oxide layer; and
forming a contact electrically coupled to the source/drain feature, wherein the second portion of the oxide layer remains disposed on the source/drain feature after the forming of the contact.

17. The method of claim 16, wherein the source/drain feature further includes a second semiconductor element that is different from the first semiconductor element,
wherein the oxidizing of the first semiconductor element of the source/drain feature to produce the oxide layer further generates a region of the source/drain feature with a greater concentration of the second semiconductor element than a remainder of the source/drain feature.

18. The method of claim 17, further comprising:
introducing a metal material to the region of the source/drain feature to form a germanide layer of the source/drain feature; and
introducing nitrogen to the germanide layer to form a nitridized cap layer on a remainder of the germanide layer, wherein the contact physically contacts the nitridized cap layer.

19. The method of claim 16, further comprising forming a silicide feature on the exposed portion of the source/drain feature, and
wherein the silicide feature interfaces with the second portion of the oxide layer.

20. The method of claim 16, further comprising:
forming a first gate stack on the substrate, wherein the source/drain feature is associated with the first grate stack;
forming a contact etch stop layer directly on the oxide layer;
replacing a first gate electrode of the first gate stack with a second gate electrode formed of a different material, wherein the replacing of the first gate electrode of the first gate stack with the second gate electrode occurs prior to the removing of the first portion of the oxide layer to expose the portion of the source/drain feature; and
removing a portion of the contact etch stop layer to expose the first portion of the oxide layer.

\* \* \* \* \*